United States Patent
Kyung et al.

(10) Patent No.: US 7,962,828 B2
(45) Date of Patent: Jun. 14, 2011

(54) APPARATUS AND METHOD FOR CODING/DECODING BLOCK LOW DENSITY PARITY CHECK CODE IN A MOBILE COMMUNICATION SYSTEM

(75) Inventors: Gyu-Bum Kyung, Seoul (KR); Hong-Sil Jeong, Incheon (KR); Jae-Yoel Kim, Gunpo-si (KR); Sung-Eun Park, Suwon-si (KR); Kyeong-Cheol Yang, Pohang-si (KR); Se-Ho Myung, Pohang-si (KR)

(73) Assignee: Samsung Electronics Co., Ltd (KR)

( * ) Notice: Subject to any disclaimer, the term of this patent is extended or adjusted under 35 U.S.C. 154(b) by 959 days.

(21) Appl. No.: 11/831,688

(22) Filed: Jul. 31, 2007

(65) Prior Publication Data
US 2007/0283221 A1 Dec. 6, 2007

Related U.S. Application Data

(63) Continuation of application No. 10/926,932, filed on Aug. 26, 2004, now Pat. No. 7,313,752.

(30) Foreign Application Priority Data

Aug. 26, 2003 (KR) .................. 10-2003-0059206

(51) Int. Cl.
*H03M 13/00* (2006.01)
(52) U.S. Cl. .................. 714/758; 714/801
(58) Field of Classification Search .......... 714/758, 714/801
See application file for complete search history.

(56) References Cited

U.S. PATENT DOCUMENTS

| 4,680,764 A | 7/1987 | Suzuki et al. |
| 6,539,367 B1 | 3/2003 | Blanksby et al. |

(Continued)

FOREIGN PATENT DOCUMENTS

JP 2001-168733 6/2001

(Continued)

OTHER PUBLICATIONS

Jon-Lark Kim, "Explicit Construction of Families of LDPC Codes with Girth at Least Six", Oct. 2002.

(Continued)

*Primary Examiner* — M. Mujtaba K Chaudry
(74) *Attorney, Agent, or Firm* — The Farrell Law Firm, P.C.

(57) ABSTRACT

A method for generating a parity check matrix of a block LDPC code. The parity check matrix includes an information part corresponding to an information word and a first parity part and a second parity part each corresponding to a parity. The method includes determining a size of the parity check matrix based on a coding rate applied when coding the information word with the block LDPC code, and a codeword length; dividing a parity check matrix with the determined size into a predetermined number of blocks; classifying the blocks into blocks corresponding to the information part, blocks corresponding to the first parity part, and blocks corresponding to the second parity part; arranging permutation matrixes in predetermined blocks from among the blocks classified as the first parity part, and arranging identity matrixes in a full lower triangular form in predetermined blocks from among the blocks classified as the second parity part; and arranging the permutation matrixes in the blocks classified as the information part such that a minimum cycle length is maximized and weight values are irregular on a factor graph of the block LDPC code.

44 Claims, 17 Drawing Sheets

U.S. PATENT DOCUMENTS

| | | | |
|---|---|---|---|
| 6,633,856 B2 * | 10/2003 | Richardson et al. | 706/15 |
| 6,789,227 B2 * | 9/2004 | De Souza et al. | 714/804 |
| 6,895,547 B2 * | 5/2005 | Eleftheriou et al. | 714/801 |
| 7,000,174 B2 | 2/2006 | Mantha et al. | |
| 7,000,177 B1 | 2/2006 | Wu et al. | |
| 7,072,417 B1 * | 7/2006 | Burd et al. | 375/295 |
| 7,139,959 B2 * | 11/2006 | Hocevar | 714/752 |
| 2002/0181569 A1 | 12/2002 | Goldstein et al. | |
| 2003/0014718 A1 * | 1/2003 | De Souza et al. | 714/804 |
| 2003/0033575 A1 | 2/2003 | Richardson et al. | |
| 2003/0037298 A1 | 2/2003 | Eleftheriou et al. | |
| 2003/0074626 A1 | 4/2003 | Coker et al. | |
| 2004/0034828 A1 * | 2/2004 | Hocevar | 714/800 |
| 2004/0148560 A1 * | 7/2004 | Hocevar | 714/801 |

FOREIGN PATENT DOCUMENTS

| | | |
|---|---|---|
| JP | 2003-115768 | 4/2003 |
| KR | 1020030018281 | 3/2003 |
| SU | 1505451 | 8/1989 |
| WO | WO 00/35103 | 6/2000 |
| WO | WO 02/095965 | 11/2002 |
| WO | WO 03/032499 | 4/2003 |

OTHER PUBLICATIONS

John L. Fan, "Array Codes as Low-Density Parity-Check Codes", Sep. 2000.

Rich Echard et al., "The Π-Rotation Low-Density Parity Check Codes", Nov. 25, 2001.

Dale E. Hocevar, "Efficient Encoding for a Family of Quasi-Cyclic LDPC Codes", Dec. 1, 2003.

Echard et al., The Extended Irregular Π-Rotation LDPC Codes, IEEE Communications Letters, vol. 7, No. 5, May 2003, pp. 230-232.

Yeo et al., Architectures and Implementations of Low-Density Parity Check Decoding Algorithms, 2002 Midwest Symposium on Circuits and Systems, Aug. 4, 2002.

Zhang et al., an FPGA Implementation of (3,6)-Regular Low-Density Parity Check Code Decoder, EURASIP Journal of Applied Signal Processing, Aug. 4, 2002.

Richardson et al., Efficient Encoding of Low-Density Parity-Check Codes, IEEE Transactions on Information Theory, Feb. 2, 2001.

Eleftheriou et al., Low-Density Parity-Check Codes for Digital Subscriber Lines, 2002 IEEE International Conference on Communications, Apr. 28, 2004.

Mittelholzer et al., Efficient Encoding and Minimum Distance Bounds of Reed-Solomon-Type Array Codes, 2002 IEEE International Symposium on Information Theory, Jun. 30, 2002.

Djurdhevic et al., "Graph-Theoretic Construction of Low-Density Parity-Check Codes", IEEE Communications Letters, Apr. 2003.

Tian et al., "Construction of Irregular LDPC Codes with Low Error Floors", Proceedings of the IEEE International Conference on Communications, May 11, 2003.

* cited by examiner

| $P^a{}_{11}$ | $P^a{}_{12}$ | $P^a{}_{13}$ | $P^a{}_{14}$ | ... | $P^a{}_{1(q-1)}$ | $P^a{}_{1q}$ |
|---|---|---|---|---|---|---|
| $P^a{}_{21}$ | $P^a{}_{22}$ | $P^a{}_{23}$ | $P^a{}_{24}$ | ... | $P^a{}_{2(q-1)}$ | $P^a{}_{2q}$ |
| $P^a{}_{31}$ | $P^a{}_{32}$ | $P^a{}_{33}$ | $P^a{}_{34}$ | ... | $P^a{}_{3(q-1)}$ | $P^a{}_{3q}$ |
| ⋮ | ⋮ | ⋮ | ⋮ | ... | ⋮ | ⋮ |
| $P^a{}_{p1}$ | $P^a{}_{p2}$ | $P^a{}_{p3}$ | $P^a{}_{p4}$ | ... | $P^a{}_{p(q-1)}$ | $P^a{}_{pq}$ |

FIG.3
(PRIOR ART)

$$P = \begin{bmatrix} 0 & 1 & 0 & \cdots & 0 \\ 0 & 0 & 1 & \cdots & 0 \\ \vdots & \vdots & \vdots & & \vdots \\ 0 & 0 & 0 & \cdots & 1 \\ 1 & 0 & 0 & \cdots & 0 \end{bmatrix}$$

FIG.4
(PRIOR ART)

$$H \triangleq \begin{bmatrix} I & I & I & \cdots & I \\ I & P & P^2 & \cdots & P^{s-1} \\ I & P^2 & P^4 & \cdots & P^{2(s-1)} \\ \vdots & \vdots & \vdots & & \vdots \\ I & P^{r-1} & P^{(r-1)2} & \cdots & P^{(r-1)(s-1)} \end{bmatrix}$$

FIG.5
(PRIOR ART)

$$\begin{bmatrix} I & I & I & \cdots & I & I & \cdots & I \\ O & I & P & \cdots & P^{(r-2)} & P^{(r-1)} & \cdots & P^{(k-1)} \\ O & O & I & \cdots & P^{2(r-3)} & P^{2(r-2)} & \cdots & P^{2(k-3)} \\ \vdots & \vdots & \vdots & \cdots & \vdots & \vdots & & \vdots \\ O & O & \cdots & O & I & P^{(r-1)} & \cdots & P^{(r-1)(k-r)} \end{bmatrix}$$

| $P^{a_{11}}$ | $P^{a_{12}}$ | $P^{a_{13}}$ | $P^{a_{14}}$ | ... | $P^{a_{1(n-1)}}$ | $P^{a_{1n}}$ | $P^{a_1}$ | 1 | 0 | 0 | 0 |
|---|---|---|---|---|---|---|---|---|---|---|---|
| $P^{a_{21}}$ | $P^{a_{22}}$ | $P^{a_{23}}$ | $P^{a_{24}}$ | ... | $P^{a_{2(n-1)}}$ | $P^{a_{2n}}$ | ⋮ | $P^{a_2}$ | 1 | 0 | 0 |
| $P^{a_{31}}$ | $P^{a_{32}}$ | $P^{a_{33}}$ | $P^{a_{34}}$ | ... | $P^{a_{3(n-1)}}$ | $P^{a_{3n}}$ | $P^y$ | 0 | $P^{a_3}$ | 1 | 0 |
| ... | ... | ... | ... | ⋮ | ... | ... | ⋮ | ⋮ | ⋮ | ... | ... |
| $P^{a_{m1}}$ | $P^{a_{m2}}$ | $P^{a_{m3}}$ | $P^{a_{m4}}$ | ... | $P^{a_{m(n-1)}}$ | $P^{a_{mn}}$ | $P^x$ | 0 | 0 | 0 | $P^{a_m}$ |

INFORMATION PART / PARITY PART

APPARATUS AND METHOD FOR CODING/DECODING BLOCK LOW DENSITY PARITY CHECK CODE IN A MOBILE COMMUNICATION SYSTEM

PRIORITY

This application is a Continuation of U.S. application Ser. No. 10/926,932, filed on Aug. 26, 2004, now U.S. Pat. No. 7,313,752, which claims priority under 35 U.S.C. §119 to an application filed in the Korean Intellectual Property Office on Aug. 26, 2003 and assigned Serial No. 2003-59206, the contents of each of which are incorporated herein by reference.

BACKGROUND OF THE INVENTION

1. Field of the Invention

The present invention relates generally to a mobile communication system, and in particular, to an apparatus and method for coding/decoding block low density parity check (LDPC) codes.

2. Description of the Related Art

With the introduction of a cellular mobile communication system in the U.S. in the late 1970's, South Korea started to provide a voice communication service in an Advanced Mobile Phone Service (AMPS) system, a first generation G) analog mobile communication system. In the mid 1990's, South Korea commercialized a Code Division Multiple Access (CDMA) system, a second generation (2G) mobile communication system, to provide voice and low-speed data services.

In the late 1990's, South Korea partially deployed an IMT-2000 (International Mobile Telecommunication-2000) system, a third generation (3G) mobile communication system, aimed at advanced wireless multimedia services, worldwide roaming, and high-speed data services. The 3G mobile communication system was especially developed to transmit data at a high rate in compliance with the rapid increase in the amount of serviced data. That is, the 3G mobile communication system has evolved into a packet service communication system, and the packet service communication system transmits burst packet data to a plurality of mobile stations and is designed for the transmission of mass data. The packet service communication system is being developed for a high-speed packet service.

The 3G mobile communication system is evolving into a fourth generation (4G) mobile communication system. The 4G mobile communication system is under standardization for standardizing the interworking and integration between a wired communication network and a wireless communication network beyond simple wireless communication service which the previous-generation mobile communication systems provided. Technology for transmitting large volumes of data at and up to a capacity level available in the wired communication network must be developed for the wireless communication network.

As a high-speed, high-capacity communication system capable of processing and transmitting data such as image and radio data as well as simple voice service data is required, it is necessary to increase the system transmission efficiency using an appropriate channel coding scheme in order to improve the system performance. A mobile communication system inevitably experiences errors occurring due to noise, interference and fading according to a channel condition during data transmission. The occurrence of the errors causes a loss of information data.

In order to reduce the information data loss due to the occurrence of errors, it is possible to improve reliability of the mobile communication system by using various error-control techniques. One technique using an error-correcting code is the most popularly used error-control technique. A description will now be made of a turbo code and a low density parity check (LDPC) code which are typical error correcting codes.

Turbo Code

The turbo code is an error correcting code used in both a synchronous 3G mobile communication system and an asynchronous 3G mobile communication system. It is well known that the turbo code is superior in performance gain to a convolutional code previously used as a main forward error correction code, during high-speed data transmission. In addition, the turbo code is advantageous in that it can efficiently correct an error caused by noises generated in a transmission channel, thereby increasing the reliability of the data transmission.

LDPC Code

The LDPC code can be decoded using an iterative decoding algorithm base on a sum-product algorithm of a factor graph. Because a decoder for the LDPC code uses the sum-product algorithm-based iterative decoding algorithm, it is less complex than a decoder for the turbo code. In addition, the decoder for the LDPC code is easy to implement with a parallel processing decoder, compared with the decoder for the turbo code. When the LDPC code is expressed with a factor graph, cycles exist on the factor graph of the LDPC code. It is well known that iterative decoding on the factor graph of the LDPC code where cycles exist is less than optimized (sub-optimal). Also, it has been experimentally proved that the LDPC code has excellent performance through iterative decoding. However, when many cycles with a short length exist on the factor graph of the LDPC code, the LDPC code suffers from performance degradation. Therefore, studies are continuously being conducted to develop a technique for designing a LDPC code such that no cycles with a short lengths exist on the factor graph of the LDPC code.

A coding process of the LDPC code has evolved into a coding process that uses a parity check matrix having a low weight density due to a characteristic of a generating matrix generally having a high weight density. The "weight" represents an element having a non-zero value from among the elements constituting the generating matrix and parity check matrix. In particular, if a partial matrix corresponding to a parity in the parity check matrix has a regular format, more efficient coding is possible.

Because the LDPC code includes various codes having a non-zero value, it is very important to develop an efficient coding algorithm and an efficient decoding algorithm for various types of LDPC codes in putting the LDPC code to practical use. In addition, because the parity check matrix of the LDPC code determines the performance of the LDPC code, it is also very important to design a parity check matrix having excellent performance. That is, an efficient parity check matrix having excellent performance, an efficient coding algorithm, and an efficient decoding algorithm must be simultaneously considered in order to generate a high-performance LDPC code.

One LDPC code is defined by a parity check matrix in which major elements have a value of 0 and minor elements except the elements having the value of 0 have a value of 1. For example, an (N, j, k) LDPC code is a linear block code having a block length N, and is defined by a sparse parity check matrix in which each column has j elements having a value of 1, each row has k elements having a value of 1, and all of the elements except for the elements having the value of 1 all have a value of 0.

An LDPC code in which a weight value of each column in the parity check matrix is fixed to 'j' and a weight value of each row in the parity check matrix is fixed to 'k' as stated above, is called a "regular LDPC code." Herein, the weight value represents the number of weights. Unlike the regular LDPC code, an LDPC code in which the weight value of each column in the parity check matrix and the weight value of each row in the parity check matrix are not fixed is called an "irregular LDPC code." It is generally known that the irregular LDPC code is superior in performance to the regular LDPC code. However, in the case of the irregular LDPC code, because the weight value of each column and the weight value of each row in a parity check matrix are not fixed, i.e. are irregular, the weight value of each column in the parity check matrix and the weight value of each row in the parity check matrix must be properly adjusted in order to guarantee the excellent performance.

With reference to FIG. 1, a description will now be made of a parity check matrix of an (8, 2, 4) LDPC code as an example of an (N, j, k) LDPC code.

FIG. 1 is a diagram illustrating a parity check matrix of a general (8, 2, 4) LDPC code. Referring to FIG. 1, a parity check matrix H of the (8, 2, 4) LDPC code is comprised of 8 columns and 4 rows, wherein a weight value of each column is fixed to 2 and a weight value of each row is fixed to 4. Because the weight value of each column and the weight value of each row in the parity check matrix are regular as stated above, the (8, 2, 4) LDPC code illustrated in FIG. 1 becomes a regular LDPC code.

A factor graph of the (8, 2, 4) LDPC code described in connection with FIG. 1 will be described herein below with reference to FIG. 2.

FIG. 2 is a diagram illustrating a factor graph of the (8, 2, 4) LDPC code of FIG. 1. Referring to FIG. 2, a factor graph of the (8, 2, 4) LDPC code is comprised of 8 variable nodes of $x_1$ 211, $x_2$ 213, $x_3$ 215, $x_4$ 217, $x_5$ 219, $x_6$ 221, $x_7$ 223 and $x_8$ 225, and 4 check nodes 227, 229, 231 and 233. When an element having a weight, i.e., a value of 1, exists at a point where an $i^{th}$ row and a $j^{th}$ column of the parity check matrix of the (8, 2, 4) LDPC code cross each other, a branch is formed between a variable node xj and a $i^{th}$ check node.

Because the parity check matrix of the LDPC code has a small weight value as described above, it is possible to perform the decoding through a iterative decoding process even in a block code having a relatively long length, that exhibits a performance approximating a capacity limit of a Shannon channel such as a turbo code while continuously increasing a block length of the block code. It has been proven that an iterative decoding process of an LDPC code using a flow transfer technique is almost approximate to an iterative decoding process of a turbo code in performance.

In order to generate a high-performance LDPC code, the following conditions should be satisfied.

(1) Cycles on a Factor Graph of an LDPC Code Should be Considered.

The "cycle" refers to a loop formed by the edges connecting the variable nodes to the check nodes in a factor graph of an LDPC code, and a length of the cycle is defined as the number of edges constituting the loop. A cycle being long in length means that the number of edges connecting the variable nodes to the check nodes constituting the loop in the factor graph of the LDPC code is large. In contrast, a cycle being short in length means that the number of edges connecting the variable nodes to the check nodes constituting the loop in the factor graph of the LDPC code is small.

As cycles in the factor graph of the LDPC code become longer, the performance efficiency of the LDPC code increases, for the following reasons. That is, when long cycles are generated in the factor graph of the LDPC code, it is possible to prevent the performance degradation such as an error floor occurring when too many cycles with a short length exist on the factor graph of the LDPC code.

(2) Efficient Encoding of an LDPC Code Should be Considered.

It is hard to subject the LDPC code to real-time coding compared with a convolutional code or a turbo code because of its high coding complexity. In order to reduce the encoding complexity of the LDPC code, a Repeat Accumulate (RA) code has been proposed. The RA code also has a limitation in the reduction the encoding complexity of the LDPC code. Therefore, an efficient encoding of the LDPC code should be considered.

(3) Degree Distribution on a Factor Graph of an LDPC Code Should be Considered.

Generally, an irregular LDPC code is superior in performance to a regular LDPC code, because a factor graph of the irregular LDPC code has various degrees. The "degree" refers to the number of edges connected to the variable nodes and the check nodes in the factor graph of the LDPC code. Further, "degree distribution" on a factor graph of an LDPC code refers to a ratio of the number of nodes having a particular degree to the total number of nodes. It has been proved that an LDPC code having a particular degree distribution is superior in performance.

FIG. 3 is a diagram illustrating a parity check matrix of a general block LDPC code. Before a description of FIG. 3 is given, it should be noted that the block LDPC code is a new LDPC code for which not only efficient coding but also efficient storage and performance improvement of a parity check matrix were considered, and the block LDPC code is an LDPC code extended by generalizing a structure of a regular LDPC code. Referring to FIG. 3, a parity check matrix of the block LDPC code is divided into a plurality of partial blocks, and a permutation matrix is mapped to each of the partial blocks. In FIG. 3, 'P' represents a permutation matrix having an $N_s \times N_s$ size, and a superscript (or exponent) $a_{ij}$ of the permutation matrix P is either $0 \leq a_{ij} \leq N_s - 1$ or $a_{ij} = \infty$. In FIG. 3, p represents the number of the row of the partial blocks, and q represents the number of the column of the partial blocks. The 'i' means that a corresponding permutation matrix is located in the $i^{th}$ row of the partial blocks of the parity check matrix, and the 'j' means that a corresponding permutation matrix is located in the $j^{th}$ column of the partial blocks of the parity check matrix. That is, $P^{a_{ij}}$ is a permutation matrix located in a partial block crossed with the $i^{th}$ row and the $j^{th}$ column.

The permutation matrix will now be described with reference to FIG. 4.

FIG. 4 is a diagram illustrating the permutation matrix P of FIG. 3. As illustrated in FIG. 4, the permutation matrix P is a square matrix having an $N_s \times N_s$ size, and each of $N_s$ columns constituting the permutation matrix P has a weight of 1 and each of $N_s$ rows constituting the permutation matrix P also has a weight of 1.

In FIG. 3, a permutation matrix with a superscript $a_{ij}=0$, i.e. a permutation matrix $P^0$, represents an identity matrix $I_{N_s \times N_s}$, and a permutation matrix with a superscript $a_{ij}=\infty$, i.e. a permutation matrix $P^\infty$, represents a zero matrix.

In the entire parity check matrix of the block LDPC code illustrated in FIG. 3, because the total number of rows is $N_s \times p$ and the total number of columns is $N_s \times q$ (for $p \leq q$), when the entire parity check matrix of the LDPC code has a full rank, a coding rate can be expressed as Equation (1) regardless of a size of the partial blocks.

$$R = \frac{N_s \times q - N_s \times p}{N_s \times q} = \frac{q-p}{q} = 1 - \frac{p}{q} \qquad (1)$$

If $a_{ij} \neq \infty$ for all i and j, the permutation matrixes corresponding to the partial blocks are not zero matrixes, and the partial blocks constitute a regular LDPC code in which the weight value of each column and the weight value of each row in each of the permutation matrixes corresponding to the partial blocks are p and q, respectively. Here, each of permutation matrixes corresponding to the partial blocks will be referred to as "partial matrix."

Because (p−1) dependent rows exist in the entire parity check matrix, a coding rate is higher than the coding rate calculated by Equation (1). In the case of the block LDPC code, if a weight position of a first row of each of the partial matrixes constituting the entire parity check matrix is determined, the weight positions of the remaining ($N_s$−1) rows are determined. Therefore, the required size of a memory is reduced to $1/N_s$ as compared with the case where the weights are irregularly selected to store information on the entire parity check matrix.

FIG. 5 is a diagram illustrating a parity check matrix of a general regular block LDPC code. The parity check matrix illustrated in FIG. 5 is a parity check matrix of a (s,r) array code, i.e. a regular block LDPC code. The (s,r) array code proposed is a typical regular block LDPC code, and the (s,r) array code corresponds to a block LDPC code for $N_s$=s and q=s and p=r in FIG. 3. Here, 's' is an odd prime number, and 'r' always satisfies the condition r≦s.

A parity check matrix of the (s,r) array code has $s^2$ columns and r×s rows, and a rank thereof becomes r×(s−1). The reason the rank of the parity check matrix of the (s,r) array code becomes r×(s−1) is because in the case where r partial matrixes in a row direction of the parity check matrix of the (s,r) array code, if s rows in each of the partial matrixes are summed up, a matrix in which all of the elements have a value of 1 is generated. That is, because r rows in which all elements have a value of 1 are generated, it can be understood that there are r dependent rows. Therefore, a coding rate $R_{array}$ of the (s,r) array code can be expressed as Equation (2)

$$R_{array} = \frac{s^2 - r \times (s-1)}{s^2} = 1 - \frac{r \times (s-1)}{s^2} > 1 - \frac{r}{s} \qquad (2)$$

As described above, it can be noted that in the case of the (s,r) array code, a cycle with a length 4 does not exist in a factor graph because of an algebraic characteristic thereof, and can also reduce a memory capacity as stated above.

However, because the (s,r) array code is a regular LDPC code, it is inferior to an irregular LDPC code in performance degradation. Further, the block LDPC code cannot guarantee excellent performance, because the randomness thereof is low. That is, the (s,r) array code, although efficient coding was considered, still has a high coding complexity, and in the (s,r) array code, although a cycle with a length of 4 exists, a cycle with a length of 6 also exists. Further, because a degree distribution is not considered, performance degradation occurs.

FIG. 6 is a diagram illustrating a parity check matrix of a general irregular block LDPC code. Before a description of FIG. 6 is given, it should be noted that an irregular block LDPC code is a block LDPC code given by modifying the array code described in conjunction with FIG. 5 while taking into consideration the efficient coding. In the parity check matrix of the irregular block LDPC code illustrated in FIG. 6, 'k' and 'r' are integers satisfying the condition k,r≦s (for s=prime number), 'I' denotes an identity matrix with a s×s size, and '0' denotes a zero matrix with a s×s size. The parity check matrix of the irregular block LDPC code illustrated in FIG. 6 corresponds to a parity check matrix of a block LDPC code for $N_s$=s, q=k and p=r in FIG. 3.

For the efficient coding of the LDPC code, coding was enabled within a linear time by forming a partial matrix corresponding to a parity in the entire parity check matrix as a full lower triangular matrix as illustrated in FIG. 6. A structure of the entire parity check matrix, i.e. a structure of a partial matrix corresponding to an information word and a partial matrix corresponding to a parity, will be described herein below. When the partial matrix corresponding to a parity is formed as a full lower triangular matrix in this way, the parity check matrix always has a full rank because of a structural characteristic thereof. Therefore, a block length of a modified array code, i.e. an irregular LDPC code, becomes ks, and a coding rate R can be expressed as Equation (3)

$$R = \frac{k-r}{k} = 1 - \frac{r}{k} \qquad (3)$$

However, the irregular LDPC code of FIG. 6, having a parity check matrix in which a partial matrix corresponding to a parity has the form of a full lower triangular matrix, is more efficient than the array code, but the degree of distribution on a factor graph, which must be considered during the generation of an LDPC code, was not considered, and the removal of cycles with a short length was also not considered. Therefore, it is lower than the irregular LDPC code having a randomness in an error correcting capability. Accordingly, there is a demand for an irregular LDPC code which maximizes error correcting capability.

SUMMARY OF THE INVENTION

It is, therefore, an object of the present invention to provide an apparatus and method for coding/decoding an LDPC code with a maximized error correction capability in a mobile communication system.

It is another object of the present invention to provide an apparatus and method for coding/decoding an LDPC code with a maximized minimum cycle length in a mobile communication system.

It is further another object of the present invention to provide an apparatus and method for coding/decoding an LDPC code with a minimized coding complexity in a mobile communication system.

In accordance with a first aspect of the present invention, there is provided a method for generating a parity check matrix of a block low density parity check (LDPC) code to improve error correcting capability, the parity check matrix having an information part corresponding to an information word, a first parity part corresponding to a parity, and a second parity part corresponding to a parity. The method includes the steps of determining a size of the parity check matrix based on a coding rate applied when coding the information word with the block LDPC code, and a codeword length; dividing a parity check matrix having the determined size into a predetermined number of blocks; classifying the blocks into blocks corresponding to the information part, blocks corresponding to the first parity part, and blocks corresponding to the second parity part; arranging permutation matrixes in predetermined blocks from among the blocks classified as the first parity part, and arranging identity matrixes in a full lower triangular form in predetermined blocks from among the blocks classified as the second parity part; and arranging the permutation matrixes in the blocks classified as the information part such that a minimum cycle length is maximized and weights are irregular on a factor graph of the block LDPC code.

In accordance with a second aspect of the present invention, there is provided a method for coding a block low density parity check (LDPC) code. The method includes the steps of generating a parity check matrix comprised of an information part corresponding to an information word, and a first parity part and a second parity part each corresponding to a parity, and determining a deinterleaving technique and an interleaving technique according to the parity check matrix; detecting probability values of a reception signal; generating a first signal in a present decoding process by subtracting a signal generated in a previous decoding process from the probability values of the reception signal; deinterleaving the first signal using the deinterleaving technique; detecting probability values by receiving the deinterleaved signal; generating a second signal by subtracting the deinterleaved signal from the probability values of the deinterleaved signal; and interleaving the second signal using the interleaving technique and iterative-decoding the interleaved signal.

In accordance with a third aspect of the present invention, there is provided a method for coding a block low density parity check (LDPC) code. The method includes the steps of generating a first signal by multiplying an information word by a first partial matrix of a previously generated parity check matrix comprised of an information part corresponding to an information word, and a first parity part and a second parity part each corresponding to a parity; generating a second signal by multiplying the information word by a second partial matrix of the parity check matrix; generating a third signal by multiplying the first signal by a matrix product of a third partial matrix and an inverse matrix of a fourth partial matrix of the parity check matrix; generating a fourth signal by adding the second signal and the third signal; generating a fifth signal by multiplying the fourth signal by a fifth partial matrix of the parity check matrix; generating a sixth signal by adding the second signal and the fifth signal; generating a seventh signal by multiplying the sixth signal by a matrix product of the third partial matrix and the inverse matrix of the fourth partial matrix of the parity check matrix; and multiplexing the information word, the fourth signal as a first parity, and the seventh signal as a second parity, according to a format of the block LDPC code.

In accordance with a fourth aspect of the present invention, there is provided a method for generating a parity check matrix to improve error correcting capability, the parity check matrix arranged in a matrix of rows and columns of a plurality of information partial-blocks and a plurality of parity partial-blocks, the parity check matrix divided into an information part comprised of matrixes of the information partial-blocks and a parity part comprised of matrixes of the parity partial-blocks, each of the information partial-blocks comprised of a matrix representative of a plurality of information bits, each of the parity partial-blocks comprised of a matrix representative of a plurality of parity bits, each of the information partial-blocks and the parity partial-blocks existing in a plurality of rows in the parity check matrix divided into a first information matrix, a first parity matrix, and a second parity matrix, each of the information partial-blocks and the parity partial-blocks existing in a plurality of remaining rows except for the plurality of the rows divided into a second information matrix, a third parity matrix, and a fourth parity matrix, and the first and second information matrixes, the first and third parity matrixes, and the second and fourth parity matrixes are arranged in same columns, respectively. The method includes the steps of adding the third parity matrix and a product of the fourth parity matrix, an inverse matrix of the second parity matrix and the first parity matrix such that the sum is an identity matrix; determining a transpose vector of a first parity vector corresponding to the first parity matrix and the third parity matrix by multiplying a sum of the second information matrix and a product of the fourth parity matrix, an inverse matrix of the second parity matrix and the first information matrix by an information vector corresponding to the first information matrix and the second information matrix; and determining a transpose vector of a second parity vector corresponding to the second parity matrix and the fourth parity matrix by multiplying an inverse matrix of the second parity matrix by a sum of a product of the first information matrix and a transpose vector of the information vector and a product of the first parity matrix and a transpose vector of the first parity vector.

In accordance with a fifth aspect of the present invention, there is provided a method for generating a parity check matrix of a block low density parity check (LDPC) code to improve error correcting capability, the parity check matrix arranged in a matrix of rows and columns of a plurality of partial blocks, and permutation matrixes generated by shifting an identity matrix having an $N_s \times N_s$ size by a predetermined exponent according to each of the partial blocks arranged in each of the partial blocks. The method includes the steps of determining a block cycle of the block LDPC code as a first value; and determining a second value by multiplying a second value by a value determined by subtracting a sum of exponents of permutation matrixes with an odd exponent from among permutation matrixes arranged in each of the partial blocks from a sum of exponents of permutations with an even exponent from among permutation matrixes arranged in each of the partial blocks, and performing a control operation such that each of the partial blocks has a cycle corresponding to a product of the first value and the second value.

In accordance with a sixth aspect of the present invention, there is provided an apparatus for decoding a block low density parity check (LDPC) code. The apparatus includes a variable node decoder for connecting variable nodes according to a weight of each column constituting the parity check matrix comprised of an information part corresponding to an information word, and a first parity part and a second parity part each corresponding to a parity according to a predetermined control signal, and detecting probability values of a reception signal; a first adder for subtracting a signal generated in a previous decoding process from a signal output from the variable node decoder in a present decoding process; a deinterleaver for deinterleaving a signal output from the first adder using a deinterleaving technique set according to the parity check matrix; a check node decoder for connecting check nodes according to a weight of each of rows constituting the parity check matrix and detecting probability values of a signal output from the deinterleaver according to a predetermined control signal; a second adder for subtracting a signal output from the deinterleaver from a signal output from the check node decoder; an interleaver for interleaving a signal output from the second adder using an interleaving technique set according to the parity check matrix, and outputting the interleaved signal to the variable node decoder and the first adder; and a controller for generating the parity check matrix and controlling the deinterleaving technique and the interleaving technique according to the parity check matrix.

In accordance with a seventh aspect of the present invention, there is provided an apparatus for coding a block low density parity check (LDPC) code. The apparatus includes a first matrix multiplier for multiplying a received information word by a first partial matrix of a parity check matrix comprised of an information part corresponding to an information word, and a first parity part and a second parity part each corresponding to a parity; a second matrix multiplier for multiplying the information word by a second partial matrix of the parity check matrix; a third matrix multiplier for multiplying a signal output from the first matrix multiplier by a matrix product of a third partial matrix and an inverse matrix of a fourth partial matrix of the parity check matrix; a first adder for adding a signal output from the second matrix multiplier and a signal output from the third matrix multiplier; a fourth matrix multiplier for multiplying a signal output from the first adder by a fifth partial matrix of the parity check matrix; a second adder for adding a signal output from the second matrix multiplier and a signal output from the fourth matrix multiplier; a fifth matrix multiplier for multiplying a signal output from the second adder by a matrix product of the third partial matrix and the inverse matrix of the fourth partial matrix of the parity check matrix; and switches for multiplexing the information word, the output signal of the first adder as a first parity, and the output signal of fifth matrix multiplier as a second parity, according to a format of the block LDPC code.

BRIEF DESCRIPTION OF THE DRAWINGS

The above and other objects, features and advantages of the present invention will become more apparent from the following detailed description when taken in conjunction with the accompanying drawings in which:

FIG. 3 is a diagram illustrating a parity check matrix of a general block LDPC code;

FIG. 4 is a diagram illustrating the permutation matrix P of FIG. 3;

FIG. 5 is a diagram illustrating a parity check matrix of a general regular block LDPC code;

FIG. 6 is a diagram illustrating a parity check matrix of a general irregular block LDPC code;

FIG. 12 is a diagram illustrating a parity check matrix having a form of a full lower triangular matrix;

FIG. 13 is a diagram illustrating a parity check matrix having a form similar to the form of the full lower triangular matrix;

FIG. 15 is a diagram illustrating a transpose matrix of the partial matrix B shown in FIG. 14, the partial matrix E, the partial matrix T, and an inverse matrix of the partial matrix T;

DETAILED DESCRIPTION OF THE PREFERRED EMBODIMENTS

Preferred embodiments of the present invention will now be described in detail with reference to the annexed drawings. In the following description, a descriptions of known functions and configurations incorporated herein have been omitted for conciseness.

The present invention proposes a scheme for coding and decoding a high-performance irregular low density parity check (LDPC) code. The present invention proposes a scheme for coding and decoding an irregular LDPC code in which the length of the minimum cycle on a factor graph is maximized, the coding complexity is minimized, and the degree distribution on the factor graph is optimized.

The term "cycle" as it relates to a factor graph of an LDPC code refers to a loop formed by the edges connecting the variable nodes to the check nodes in the factor graph, and the length of the cycle is defined as the number of edges constituting the loop. A cycle that is long in length means that the number of edges connecting the variable nodes to the check nodes constituting the loop in the factor graph is large. As cycles on the factor graph are generated longer in length, performance of the LDPC code becomes better. In contrast, as many cycles with a short length exist on the factor graph, the LDPC code is deteriorated in its error correcting capability because the performance degradation such as error floor occurs. That is, when many cycles with a short length exist on the factor graph, information on a particular node belonging to the cycle with a short length, starting therefrom, returns after a small number of iterations. As the number of iterations increases, the information returns to the corresponding node more frequently, so that the information cannot be correctly updated, thereby causing deterioration in error correcting capability of the LDPC code.

Figures 1, 2:
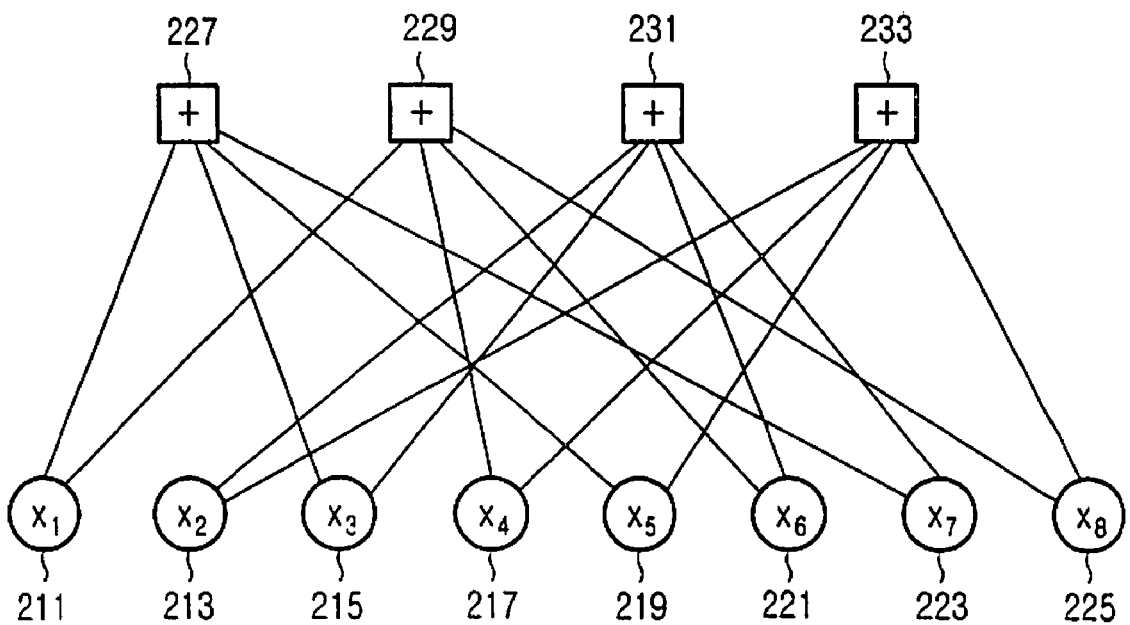
FIG. 1 is a diagram illustrating a parity check matrix of a general (8, 2, 4) LDPC code.
FIG. 2 is a diagram illustrating a factor graph of the (8, 2, 4) LDPC code of FIG. 1.
Figure 7:
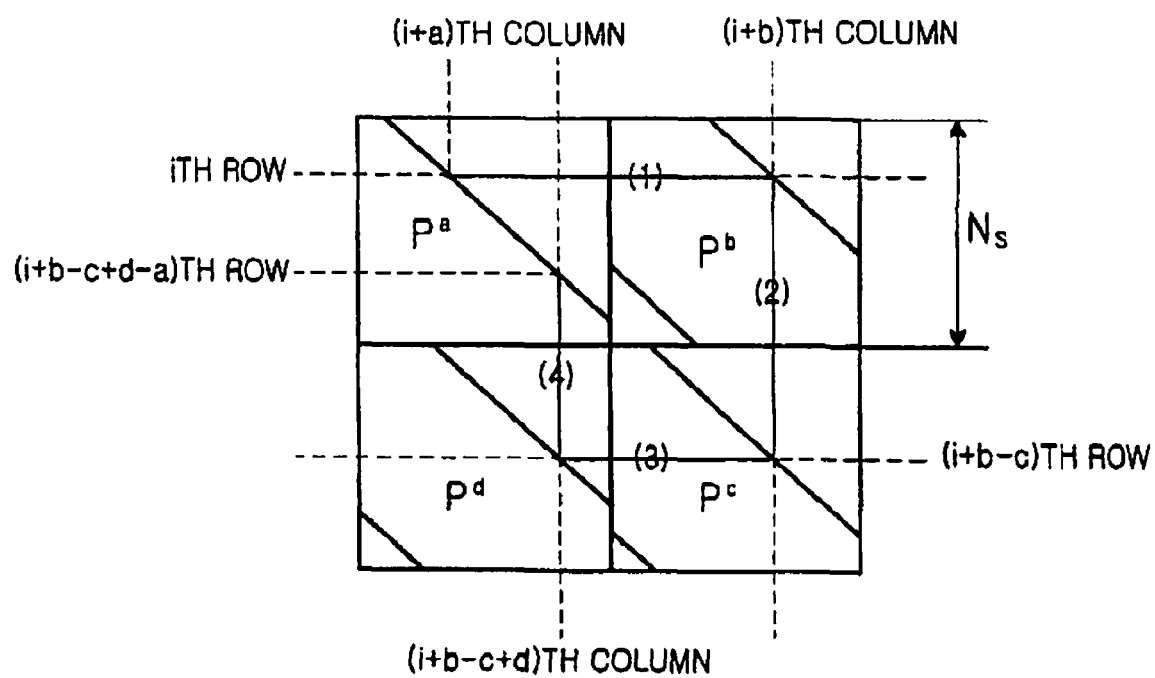
FIG. 7 is a diagram illustrating a cycle structure of a block LDPC code whose parity check matrix is comprised of 4 partial matrixes.

FIG. 7 is a diagram illustrating a cycle structure of a block LDPC code whose parity check matrix is comprised of 4 partial matrixes. Before a description of FIG. 7 is given, it should be noted that the block LDPC code is a new LDPC code for which not only efficient coding but also efficient storage and performance improvement of a parity check matrix were considered. The block LDPC code is also an LDPC code extended by generalizing a structure of a regular LDPC code. A parity check matrix of the block LDPC code illustrated in FIG. 7 is divided into 4 partial blocks, a slant line represents a position where the elements having a value of 1 are located, and the portions other than the slant-lined portions represent positions where the elements having a value of 0 are located. In addition, 'P' represents the same permutation matrix as the permutation matrix described in conjunction with FIG. 4. Here, the permutation matrix P, as described in connection with FIG. 4, is a square matrix having an $N_s \times N_s$ size, in which each of the $N_s$ columns constituting the permutation matrix P has a weight of 1 and each of the $N_s$ rows constituting the permutation matrix P also has a weight of 1. Here, "weight" represents an element having a non-zero value from among the elements constituting the parity check matrix.

In order to analyze a cycle structure of the block LDPC code illustrated in FIG. 7, an element having a value of 1 located in an $i^{th}$ row of a partial matrix $P^a$ is defined as a reference element, and an element having a value of 1 located in the $i^{th}$ row will be referred to as a "0-point." Herein, "partial matrix" will refer to a matrix corresponding to the partial block. The 0-point is located in an $(i+a)^{th}$ column of the partial matrix $P^a$.

An element having a value of 1 in a partial matrix $P^b$, located in the same row as the 0-point, will be referred to as a "1-point." For the same reason as the 0-point, the 1-point is located in an $(i+b)^{th}$ column of the partial matrix $P^b$.

Next, an element having a value of 1 in a partial matrix $P^c$, located in the same column as the 1-point, will be referred to as a "2-point." Because the partial matrix $P^c$ is a matrix acquired by shifting respective columns of an identity matrix I to the right with respect to a modulo $N_s$ by c, the 2-point is located in an $(i+b-c)^{th}$ row of the partial matrix $P^c$.

In addition, an element having a value of 1 in a partial matrix $P^d$, located in the same row as the 2-point, will be referred to as a "3-point." The 3-point is located in an $(i+b-c+d)^{th}$ column of the partial matrix $P^d$.

Finally, an element having a value of 1 in the partial matrix $P^a$, located in the same column as the 3-point, will be referred to as a "4-point." The 4-point is located in an $(i+b-c+d-a)^{th}$ row of the partial matrix $P^a$.

In the cycle structure of the LDPC code illustrated in FIG. 7, if a cycle with a length of 4 exists, the 0-point and the 4-point are located in the same position. That is, a relation between the 0-point and the 4-point is defined by Equation (4)

$$i \equiv i+b-c+d-a \pmod{N_s} \text{ or}$$

$$i+a \equiv i+b-c+d \pmod{N_s} \quad (4)$$

Equation (4) can be rewritten as Equation (5)

$$a+c \equiv b+d \pmod{N_s} \quad (5)$$

As a result, when the relationship of Equation (5) is satisfied, a cycle with a length of 4 is generated. Generally, when a 0-point and a 4m-point are identical to each other, a relation of $i \equiv i+m(b-c+d-a) \pmod{N_s}$ is given, and the following relation shown in Equation (6) is satisfied.

$$m(a-b+c-d) \equiv 0 \pmod{N_s} \quad (6)$$

In other words, if a positive integer having a minimum value from among the positive integers satisfying Equation (6) for a given a, b, c and d is defined as 'm', a cycle with a length of 4m becomes a cycle having a minimum length in the cycle structure of the block LDPC code illustrated in FIG. 7.

In conclusion, as described above, for $(a-b+c-d) \neq 0$, if $\gcd(N_s, a-b+c-d)=1$ is satisfied, then $m=N_s$. Herein, the gcd $(N_s, a-b+c-d)$ is the function for calculating the greatest common divisor of the integers $N_s$ and $a-b+c-d$. Therefore, a cycle with a length of $4N_s$ becomes a cycle with a minimum length.

The analysis on a cycle of the block LDPC code described in connection with FIG. 7 can be applied even when the number of blocks constituting the parity check matrix of the block LDPC code exceeds 4, i.e. when the number of partial matrixes constituting the parity check matrix exceeds 4. Now, with reference to FIG. 8, a description will be made of a cycle structure of an LDPC code in which the number of partial matrixes constituting a parity check matrix exceeds 4.

Figure 8:
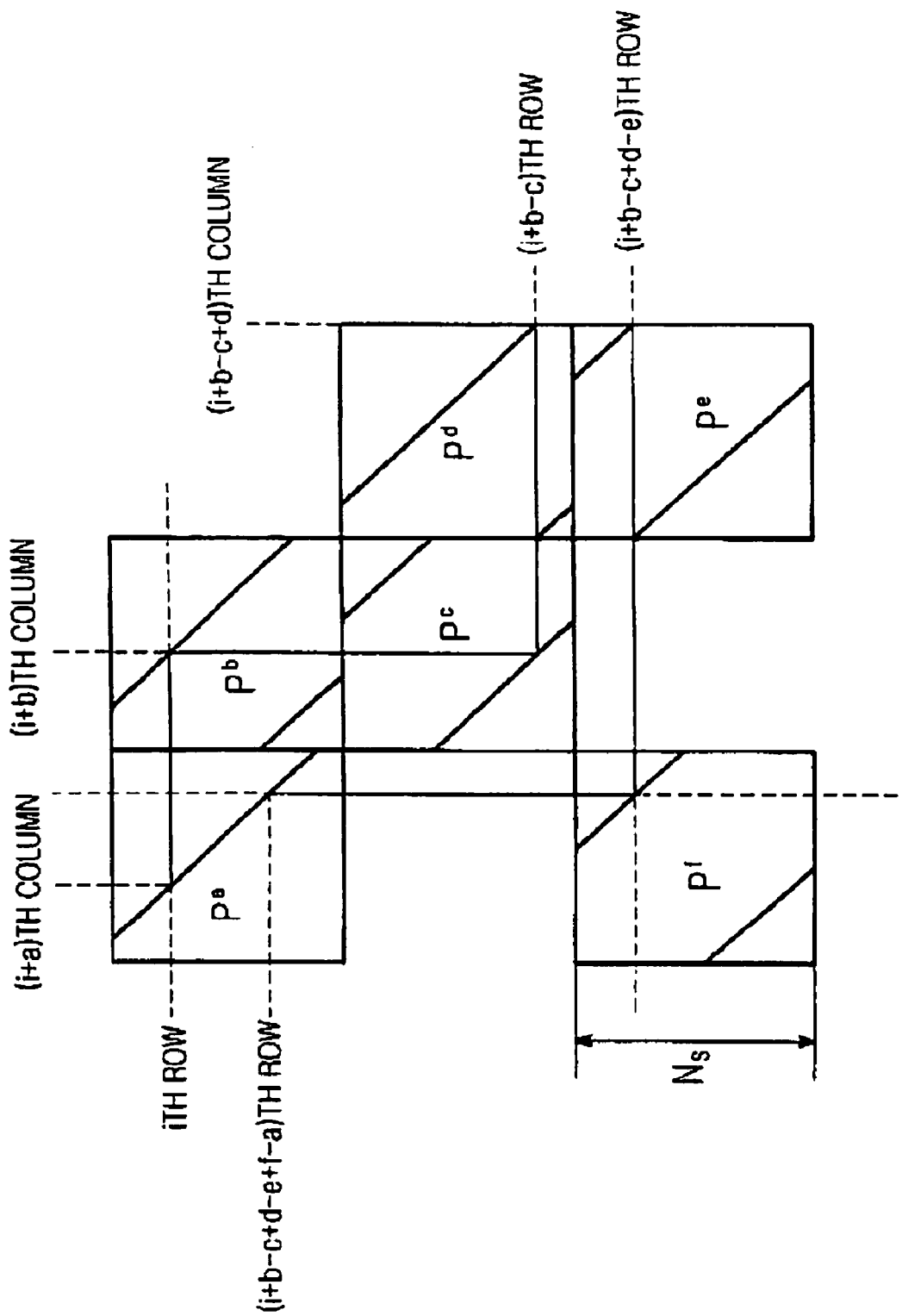
FIG. 8 is a diagram illustrating a cycle structure of a block LDPC code whose parity check matrix is comprised of 6 partial matrixes.

FIG. 8 is a diagram illustrating a cycle structure of a block LDPC code whose parity check matrix is comprised of 6 partial matrixes. A parity check matrix of a block LDPC code illustrated in FIG. 8 is comprised of 6 partial matrixes. As illustrated in FIG. 8, a slant line represents a position where elements having a value of 1 are located, and portions other than the slant-lined portions represent positions where elements having a value of 0 are located. In addition, 'P' represents the same permutation matrix as the permutation matrix described in conjunction with FIG. 4. When the cycle structure of the LDPC code illustrated in FIG. 8 is analyzed in the method described in conjunction with FIG. 7, a cycle with a length of 6m becomes a cycle having a minimum length.

Generally, when a 0-point and a 6m-point are first identical to each other, a relation of $i \equiv i+m(b-c+d-e+f-a) \pmod{N_s}$ is given, and the following relation shown in Equation (7) is satisfied.

$$m(b-c+d-e+f-a) \equiv 0 \pmod{N_s} \quad (7)$$

In other words, if a positive integer having a minimum value from among the positive integers satisfying Equation (7) for given a, b, c, d, e and f is defined as 'm', a cycle with a length of 6m becomes a cycle having a minimum length in the cycle structure of the block LDPC code illustrated in FIG. 8.

In conclusion, as described above, for $(a-b+c-d+e-f) \neq 0$, if $\gcd(N_s, a-b+c-d+e-f)=1$ is satisfied, then $m=N_s$. Therefore, a cycle with a length of $6N_s$ becomes a cycle with a minimum length.

For the block LDPC code described above, the following rules can be deduced.

Rule 1

If a cycle with a length of 2l exists in a block LDPC code, a condition of Equation (8) should be satisfied.

$$a_1+a_3+a_5+\ldots+a_{2l-1} \equiv a_2+a_4+a_6+\ldots+a_{2l} \pmod{N_s} \quad (8)$$

In Equation (8), $a_i$ (i=1, 2, ... 2l) represents the exponents of the permutation matrixes though which a cycle with a length of 2l sequentially passes. That is, a cycle with a length of 2l passes through the partial blocks constituting the parity check code of the block LDPC code in the order of $P^{a_1} \to P^{a_2} \to \ldots \to P^{a_n}$. Here, not all of the $a_i$ values should be necessarily different from one another, and the corresponding cycle may repeatedly pass through some partial blocks.

Rule 2

'm' will be defined as a minimum positive integer satisfying Equation (9).

$$m\left(\sum_{i:odd} a_i - \sum_{j:even} a_j\right) \equiv 0 \pmod{N_s}, (1 \leq i, j \leq 2l) \quad (9)$$

In Equation (9), $a_i$ represents the exponents of the permutation matrixes selected such that a block-based cycle is formed in the entire parity check matrix. As described in Rule 1, not all of the $a_i$ values should be necessarily different from one another, and the corresponding cycle may repeatedly pass through some partial blocks. As a result, the partial matrixes $P^{a_i}$ have a cycle structure in which a minimum length is 2lm.

A characteristic of the cycle structure of the block LDPC code can be easily analyzed using Rule 1 and Rule 2. For example, with the use of Rule 1 and Rule 2, it is possible not only to correctly determine how many cycles with a minimum length of 6 are distributed in an array code, but also to easily analyze a characteristic of a structure of a block-based cycle ("block cycle") of a block LDPC code, which will be described herein below. The block cycle is an important factor used for adjusting a cycle length to forming a parity check matrix, and the block cycle will be described with reference to FIG. 9, Rule 1 and Rule 2.

Figure 9:
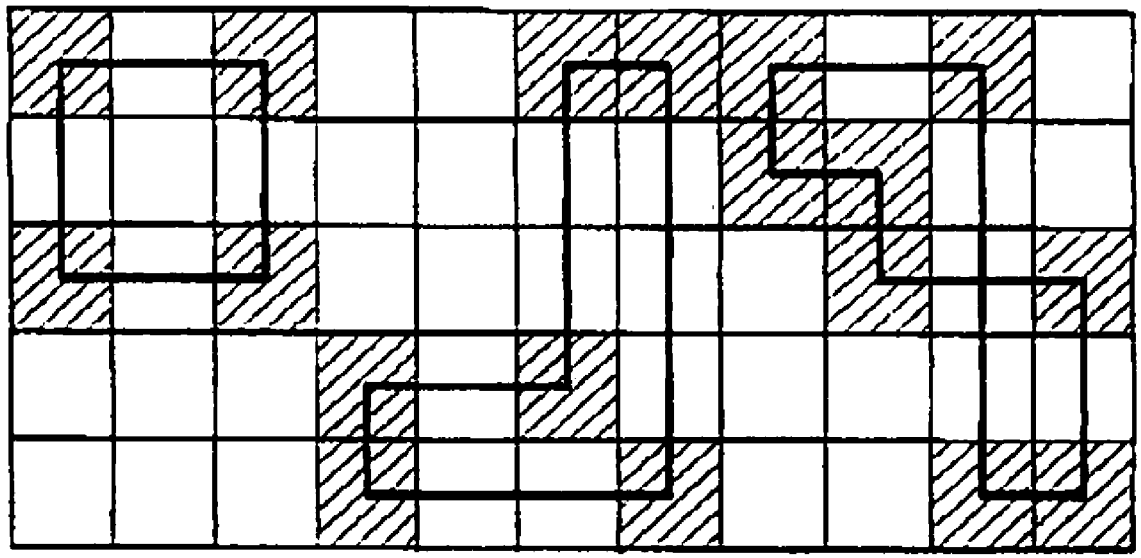
FIG. 9 is a diagram illustrating a block cycle structure of a block LDPC code.

FIG. 9 is a diagram illustrating a block cycle structure of a block LDPC code. Referring to FIG. 9, each of the blocks constituting the block LDPC code is assumed to have a weight 1, and when the blocks form a cycle, it is said that "a block cycle is formed." FIG. 9 illustrates, from the left, a block cycle formed with 4 blocks, a block cycle formed with 6 blocks, and a block cycle formed with 8 blocks. As described in Rule 1 and Rule 2, although a block cycle with a short length is formed, if the partial matrixes corresponding to the blocks constituting the block cycle are appropriately selected, it is possible to perform a control operation such that a cycle with a short length is not generated in an actual parity check matrix. However, when a plurality of the block cycles are duplicated in the block LDPC code, a minimum length of the actual cycles in the block cycles is reduced. As a result, the cycles with a short length are undesirably generated in the actual parity check matrix.

Now, with reference to FIG. 10, Rule 1 and Rule 2, a description will be made of a problem when a plurality of block cycles are duplicated in a block LDPC code, and the reason why the duplicated block cycles should be avoided when generating a parity check matrix of the LDPC code.

Figure 10:
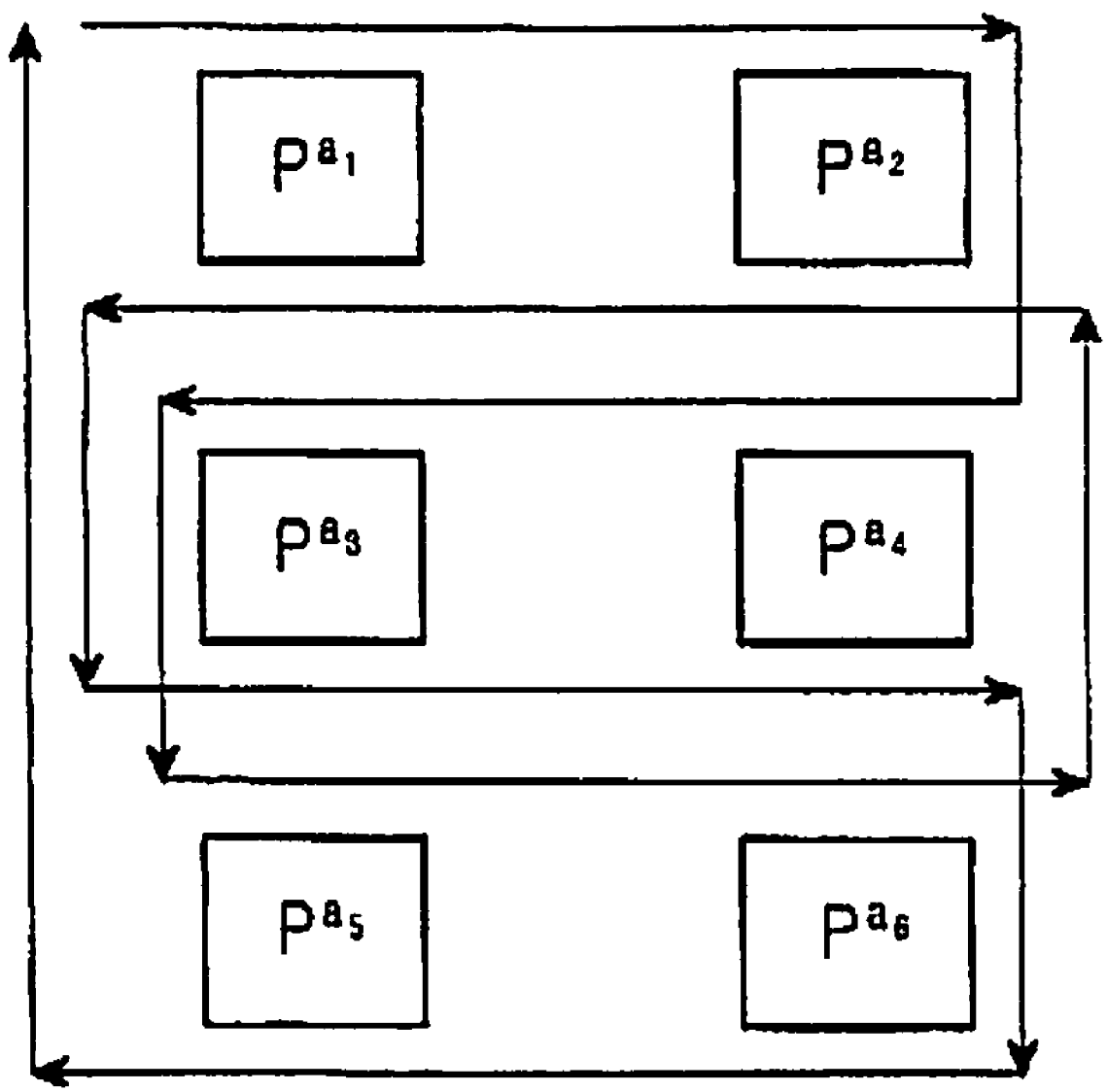
FIG. 10 is a diagram illustrating a block cycle structure of a block LDPC code in which 6 partial matrixes of a parity check matrix are duplicated.

FIG. 10 is a diagram illustrating a block cycle structure of a block LDPC code in which 6 partial matrixes of a parity check matrix are duplicated. The following sequential block order can be considered following the arrows illustrated in FIG. 10.

$$P^{a_1} \to P^{a_2} \to P^{a_4} \to P^{a_3} \to P^{a_5} \to P^{a_6} \to P^{a_2} \to P^{a_1} \to P^{a_3} \to P^{a_4} \to P^{a_6} \to P^{a_5} \to P^{a_1}$$

The exponents of the partial matrixes following the above sequential block order satisfy Equation (10) regardless of the $N_s$ values.

$$a_1 - a_2 + a_4 - a_3 + a_5 - a_6 + a_2 - a_1 + a_3 - a_4 + a_6 - a_5 \equiv 0 (\bmod N_s) \quad (10)$$

If Equation (10) is applied to Equation (9) described in Rule 2, then m=1. Therefore, in the case of the block LDPC code illustrated in FIG. 10 where there is a block cycle in which 6 partial matrixes are duplicated, even if any partial matrix constituting the entire parity check matrix is selected, the selected partial matrix always includes a cycle structure with a length of 12. That is, in the case of the block LDPC code illustrated in FIG. 10 where there is a block cycle in which 6 partial matrixes are duplicated, a minimum cycle length of the parity check matrix is limited to a maximum of 12.

Figure 11:
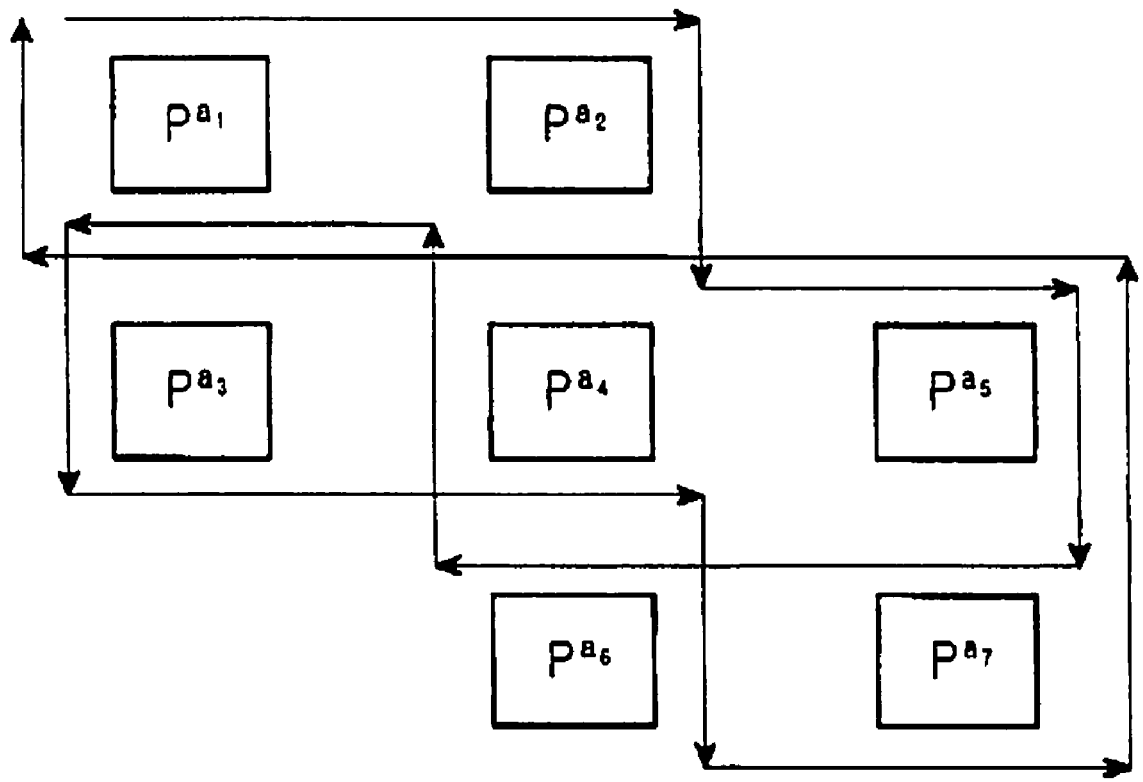
FIG. 11 is a diagram illustrating a block cycle structure of a block LDPC code in which 7 partial blocks of a parity check matrix are duplicated.

FIG. 11 is a diagram illustrating a block cycle structure of a block LDPC code in which 7 partial blocks of a parity check matrix are duplicated.

In FIG. 11, there is shown a block cycle structure of a block LDPC code where 7 partial blocks of a parity check matrix are duplicated, and the following sequential block order can be considered following the arrows illustrated in FIG. 11.

$$P^{a_1} \to P^{a_2} \to P^{a_4} \to P^{a_5} \to P^{a_7} \to P^{a_6} \to P^{a_2} \to P^{a_1} \to P^{a_3} \to P^{a_4} \to P^{a_6} \to P^{a_7} \to P^{a_5} \to P^{a_3} \to P^{a_1}$$

The exponents of the partial matrixes following the above sequential block order satisfy Equation (11) regardless of the $N_s$ values.

$$a_1 - a_2 + a_4 - a_5 + a_7 - a_6 + a_2 - a_1 + a_3 - a_4 + a_6 - a_7 + a_5 - a_3 \equiv 0 (\bmod N_s) \quad (11)$$

If Equation (11) is applied to Equation (9) described in Rule 2, then m=1. Therefore, in the case of the block LDPC code illustrated in FIG. 11 where there is a block cycle in which 7 partial matrixes are duplicated, even if any partial matrix constituting the entire parity check matrix is selected, the selected partial matrix always includes a cycle structure with a length of 14. That is, in the case of the block LDPC code illustrated in FIG. 11 where there is a block cycle in which 7 partial matrixes of the parity check matrix are duplicated, a minimum cycle length of the parity check matrix is limited to a maximum of 14.

As described above, if too many block cycles are duplicated between blocks constituting the parity check matrix in the block LDPC code, there is a limitation in maximizing a minimum length of a cycle regardless of how to select a partial matrix of the parity check matrix, thereby causing deterioration in the performance of the block LDPC code. Therefore, a parity check matrix is generated in a block LDPC code such that as few block cycles as possible are generated, thereby preventing the generation of duplicated block cycles.

Next, a description will be made of a method for generating a parity check matrix of a block LDPC code taking into consideration the efficient coding except the block cycle.

In the present invention, a Richardson-Urbanke technique will be used as a coding technique for the block LDPC code. Because the Richardson-Urbanke technique is used as a coding technique, coding complexity can be minimized such that a form of a parity check matrix can be similar to a form of a full lower triangular matrix.

Figure 12:
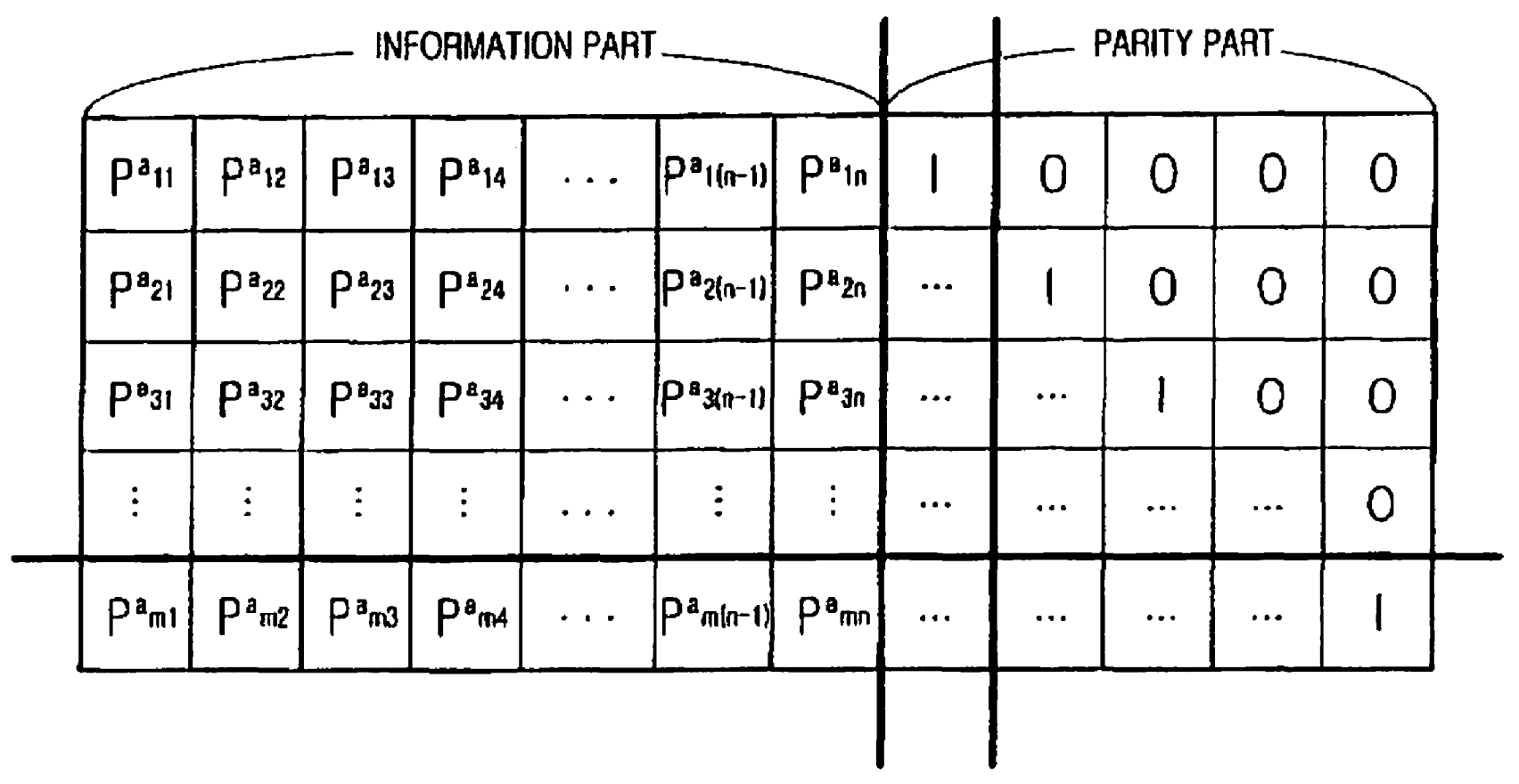

FIG. 12 is a diagram illustrating a parity check matrix having a form of a full lower triangular matrix. The parity check matrix illustrated in FIG. 12 has the form of a full lower triangular matrix, and is comprised of an information part and a parity part. The information part represents a part of the parity check matrix, mapped to an actual information word in a process of coding a block LDPC code, and the parity part represents a part of the parity check matrix, mapped to an actual parity in the process of coding the block LDPC code. In the parity part, as illustrated in FIG. 12, zero matrixes and partial matrixes exist with identity matrixes I as their starting points, and the partial matrixes have a full lower triangular form.

FIG. 13 is a diagram illustrating a parity check matrix having a form similar to the form of the full lower triangular matrix. The parity check matrix illustrated in FIG. 13 is different from the parity check matrix having a form of the full lower triangular matrix, illustrated in FIG. 12, in the parity part. In FIG. 13, a superscript (or exponent) $a_{ij}$ of the permutation matrix P is either $0 \leq a_{ij} \leq N_s - 1$ or $a_{ij} = \infty$. A permutation matrix with a superscript $a_{ij} = 0$, i.e. a permutation matrix $P^0$, represents an identity matrix $I_{N_s \times N_s}$, and a permutation matrix with a superscript $a_{ij} = \infty$, i.e. a permutation matrix $P^\infty$, represents a zero matrix. In FIG. 13, m represents the number of the row of the partial blocks mapping to the information part, and q represents the number of the column of the partial blocks mapping to the parity part. The 'i' means that a corresponding permutation matrix is located in the $i^{th}$ row of the partial blocks of the parity check matrix, and the 'j' means that a corresponding permutation matrix is located in the $j^{th}$ column of the partial blocks of the parity check matrix. That is, $P^{a_{ij}}$ is a permutation matrix located in a partial block crossed with the $i^{th}$ row and the $j^{th}$ column.

Also, superscripts $a_i$, x, y of the permutation matrixes mapping to the parity part represent superscripts of the permutation matrixes, however, for the convenience of explanation, the superscripts $a_i$, x, y are represented by different-format reference letters to distinguish from the information part. That is, in FIG. 13, $P^{a1}$ to $P^{am}$ are also permutation matrixes, the permutation matrixes $P^{a1}$ to $P^{am}$ are located in a diagonal part of the parity part. The superscripts $a_1$ to $a_m$ are serially indexed. And, permutation matrixes $P^x$ and $P^y$ are also permutation matrixes, however, for the convenience of explanation, the permutation matrixes $P^x$ and $P^y$ are represented by different-format reference letters to distinguish from the information part.

If a block length of a block LDPC code having the parity check matrix illustrated in FIG. 13 is assumed to be N, coding complexity of the block LDPC code is linearly increased with respect to the block length N.

The biggest problem of the LDPC code having the parity check matrix of FIG. 13 is that if a length of a partial block is defined as $N_s$, $N_s$ check nodes whose degrees are always 1 on a factor graph of the block LDPC code are generated. Here, the check nodes degrees cannot affect the performance improvement based on the iterative decoding. Therefore, a standard LDPC code based on the Richardson-Urbanke technique does not include a check node with a degree of 1. Therefore, a parity check matrix of FIG. 13 will be assumed as a basic parity check matrix in order to design a parity check matrix such that it enables efficient coding while not including a check node with a degree of 1. In the parity check matrix of FIG. 13 comprised of the partial matrixes, the selection of a partial matrix is a very important factor for a performance improvement of the block LDPC code, so that finding an appropriate selection criterion for the partial matrix also becomes a very important factor.

Therefore, when generating a block LDPC code, a parity check matrix is formed taking into consideration the following design criterion.

Design Criterion for Parity Check Matrix of Block LDPC Code (1) A parity part is formed to have a fixed form.

Figure 16:
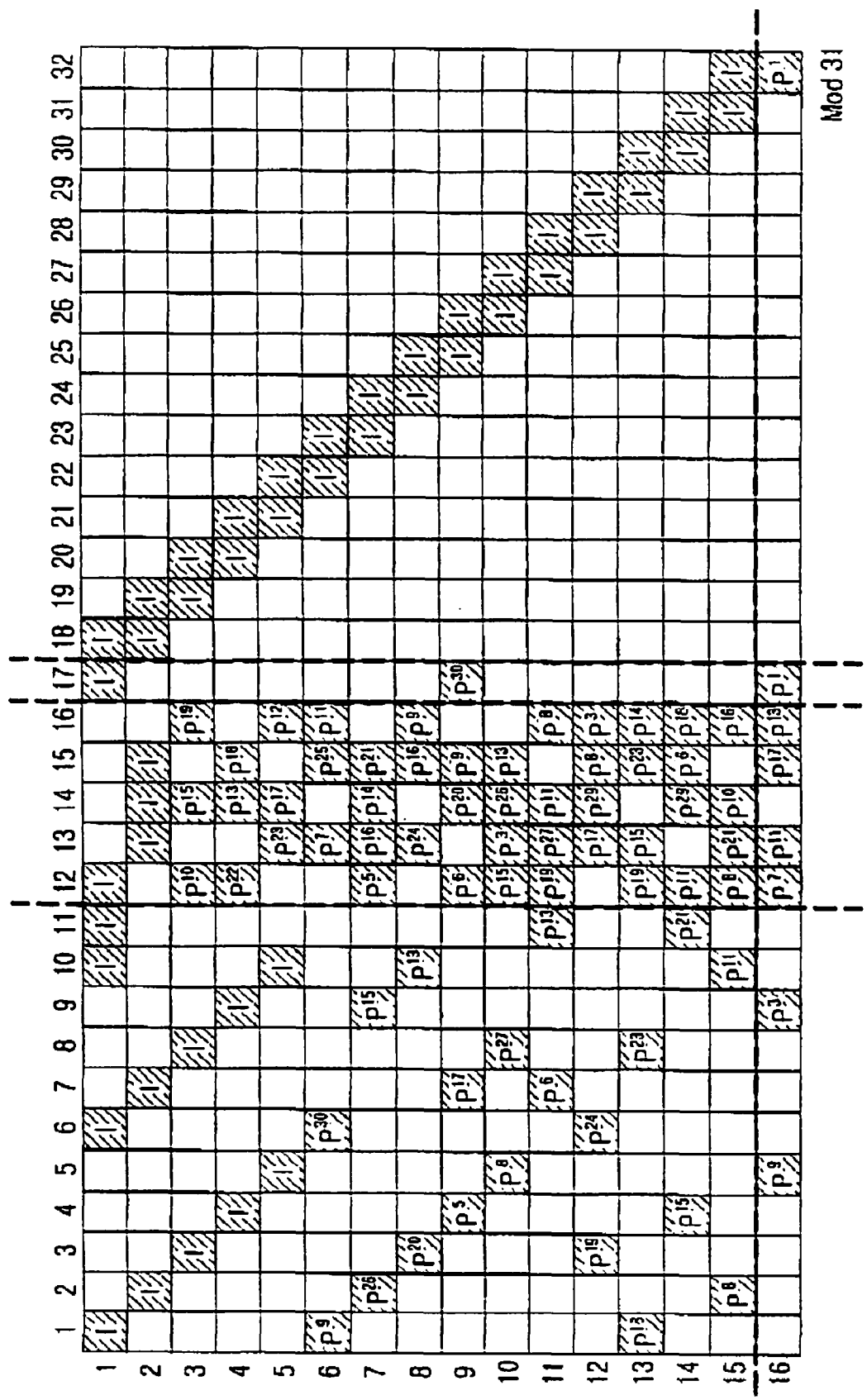
FIG. 16 is a diagram illustrating a parity check matrix of a block LDPC code according to an embodiment of the present invention.

That a parity part has a fixed form means that it has a configuration in which the identity matrixes are located as illustrated in FIG. 16 which will be described herein below.

(2) Partial matrixes with a low degree are first sequentially selected.

In the present invention, "degree" of a partial matrix refers to a degree between 3 and 5. In addition, partial matrixes are arranged such that when partial matrixes with a low degree are first sequentially selected, as few block cycles as possible are generated, and a cycle having a minimum length between partial matrixes with a low degree is formed as long as possible.

(3) Partial matrixes with a high degree are sequentially formed after partial matrixes with a low degree are all formed. When partial matrixes with a high degree are arranged, a cycle with a minimum length is formed as long as possible.

Now, a description will be made of a method for designing a parity check matrix of a block LDPC code based on the above-described design criterion for a parity check matrix of a block LDPC code.

Figure 14:
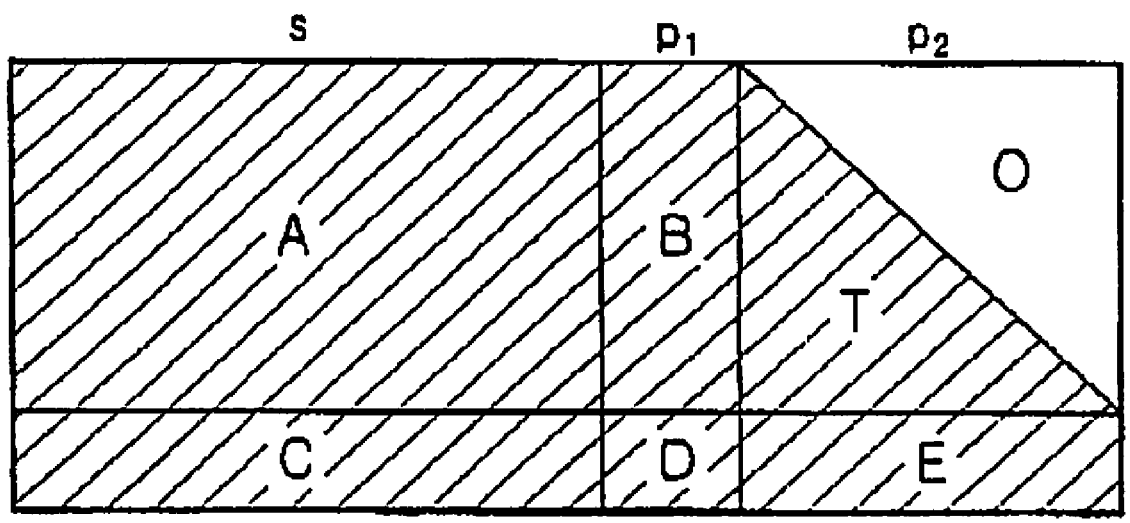
FIG. 14 is a diagram illustrating the parity check matrix of FIG. 13 which is divided into 6 partial blocks.

In order to facilitate a method of designing a parity check matrix of the block LDPC code and a method for coding the block LDPC code, the parity check matrix illustrated in FIG. 13 is assumed to be formed with 6 partial matrixes as illustrated in FIG. 14.

FIG. 14 is a diagram illustrating the parity check matrix of FIG. 13 which is divided into 6 partial blocks. Referring to FIG. 14, a parity check matrix of the block LDPC code illustrated in FIG. 14 is divided into an information part s, a first parity part $p_1$, and a second parity part $p_2$. The information part s represents a part of the parity check matrix, mapped to an actual information word in a process of coding a block LDPC code, like the information part described in conjunction with FIGS. 12 and 13, and however, for the convenience of explanation, the information part s is represented by different reference letters. The first parity part $p_1$ and the second parity part $p_2$ represent a part of the parity check matrix, mapped to an actual parity in the process of coding the block LDPC code, like the parity part described in conjunction with FIGS. 12 and 13, and the parity part is divided into two parts.

Partial matrixes A and C correspond to partial blocks A and C of the information part s, partial matrixes B and D correspond to partial blocks B and D of the first parity part $p_1$, and partial matrixes T and E correspond to partial blocks T and E of the second parity part $p_2$. Although the parity check matrix is divided into 7 partial blocks in FIG. 14, it should be noted that '0' is not a separate partial block and because the partial matrix T corresponding to the partial block T have a full lower triangular form, a region where zero matrixes are arranged on the basis of a diagonal is represented by '0'. A process of simplifying a coding method using the partial matrixes of the information part s, the first parity part $p_1$ and the second parity part $p_2$ will be described later with reference to FIG. 17.

The partial matrixes of FIG. 14 will now be described herein below with reference to FIG. 15.

Figure 15:
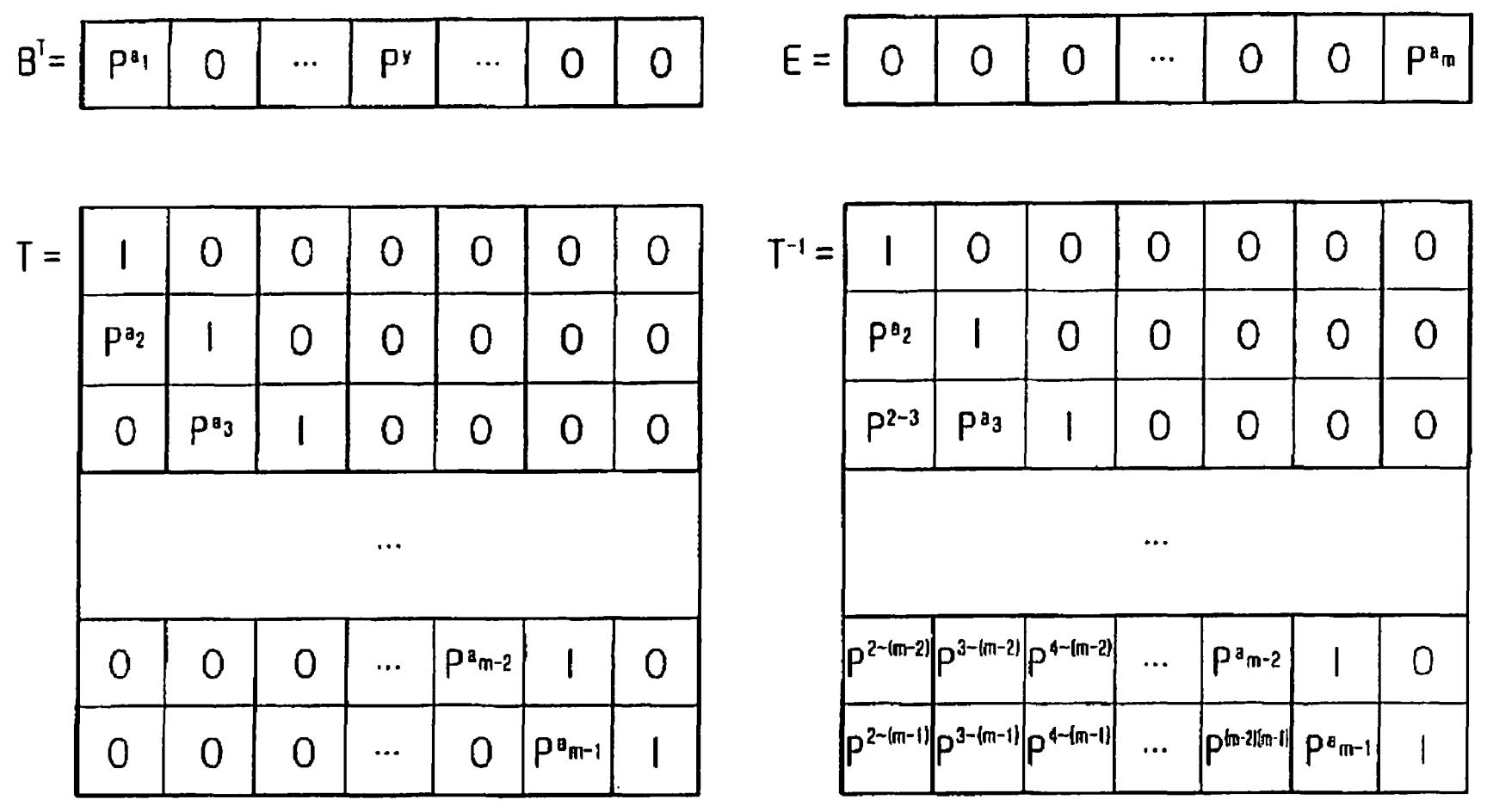

FIG. 15 is a diagram illustrating a transpose matrix of the partial matrix B shown in FIG. 14, the partial matrix E, the partial matrix T, and an inverse matrix of the partial matrix T. Referring to FIG. 15, a partial matrix $B^T$ represents a transpose matrix of the partial matrix B, and a partial matrix $T^{-1}$ represents an inverse matrix of the partial matrix T. The $P^{k_1 \sim k_2}$ represent $$\prod_{i=k_1}^{k_2} P^{a_i} = P^{\sum_{i=k_1}^{k_2} a_i}.$$

The permutation matrixes illustrated in FIG. 15, for example, $P^{a1}$ will be an identity matrix. As described above, if superscript of the permutation matrix, i.e., $a_1$ is 0, the $P^{a1}$ will be a identity matrix. Also, if superscript of the permutation matrix, i.e., $a_1$ is increased according to a predetermined value, the permutation matrix is cyclic shifted according to the predetermined value, so the permutation matrix $P^{a1}$ will be a identity matrix.

Figure 17:
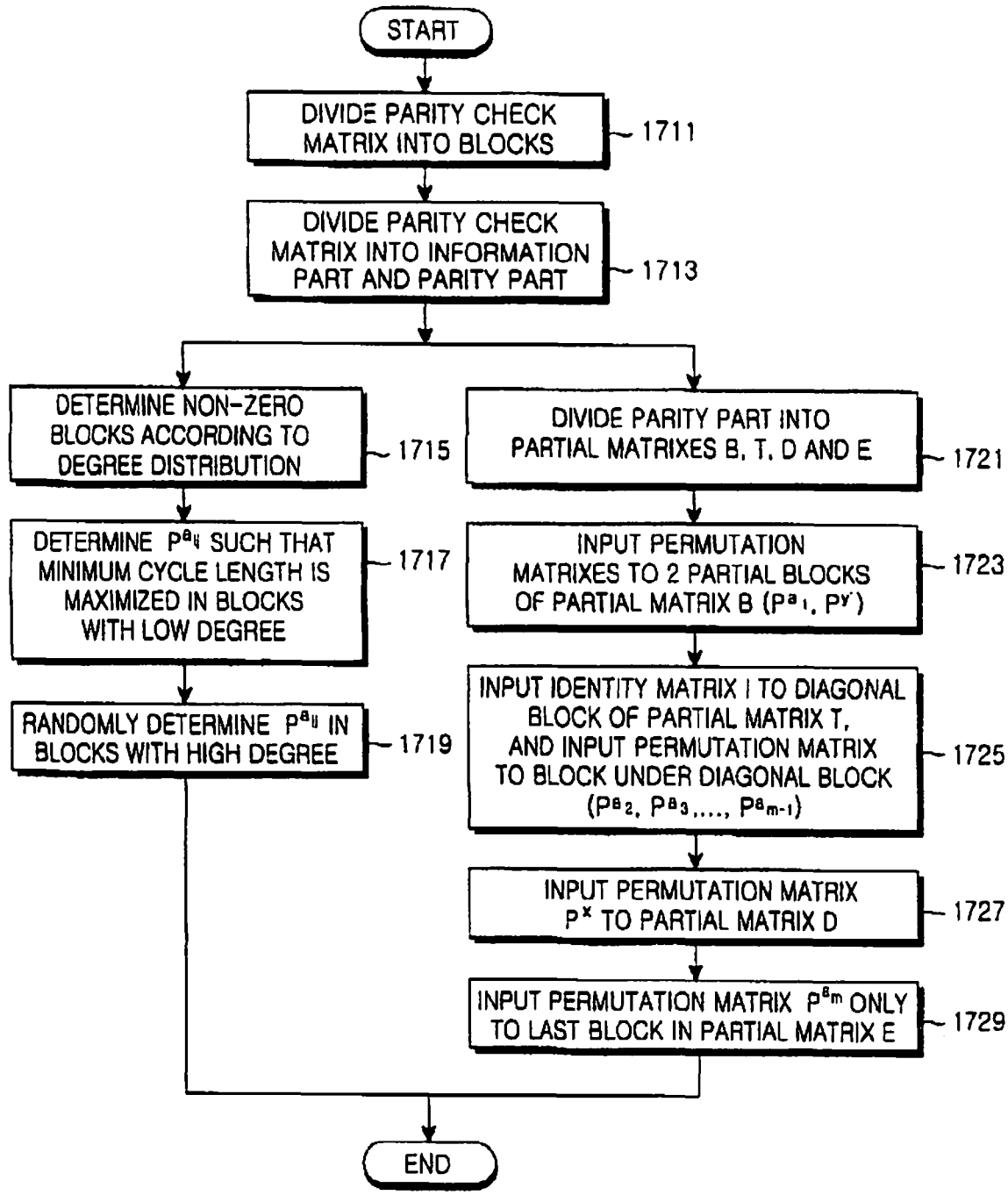
FIG. 17 is a flowchart illustrating a procedure for generating a parity check matrix of a block LDPC code according to an embodiment of the present invention.

FIG. 17 is a flowchart illustrating a procedure for generating a parity check matrix of a block LDPC code according to an embodiment of the present invention. Before a description of FIG. 17 is given, it should be noted that in order to generate a block LDPC code, a codeword size and a coding rate of a block LDPC code to be generated must be determined, and a size of a parity check matrix must be determined according to the determined codeword size and coding rate. If a codeword size of the block LDPC code is represented by N and a coding rate is represented by R, a size of a parity check matrix becomes N(1−R)×N. Actually, the procedure for generating a parity check matrix of a block LDPC code illustrated in FIG.

17 is performed only once, because the parity check matrix is initially generated and used throughout a communication system, the generated parity check matrix is used.

Referring to FIG. 17, in step 1711, a controller divides a parity check matrix with the size $N(1-R) \times N$ into a total of $p \times q$ blocks, including p blocks in a horizontal axis and q blocks in a vertical axis, and then proceeds to step 1713. Because each of the blocks has a size of $N_s \times N_s$, the parity check matrix is comprised of $N_s \times p$ columns and $N_s \times q$ rows. In step 1713, the controller classifies the $p \times q$ blocks divided from the parity check matrix into an information part s, a first parity part $p_1$, and a second parity part $p_2$, and then proceeds to steps 1715 and 1721.

In step 1715, the controller separates the information part s into non-zero blocks, or non-zero matrixes, and zero blocks, or zero matrixes according to degree distribution for guaranteeing good performance of the block LDPC code, and then proceeds to step 1717. Because the degree distribution for guaranteeing good performance of the block LDPC code has been described above, a detailed description thereof will be omitted herein. In step 1717, the controller determines the permutation matrixes $P^{a_{ij}}$ such that a minimum cycle length of a block cycle should be maximized as described above in non-zero matrix portions in blocks having a low degree from among the blocks determined according to the degree distribution for guaranteeing a good performance of the block LDPC code, and then proceeds to step 1719. Here, the permutation matrixes $P^{a_{ij}}$ should be determined taking into consideration the block cycles of not only the information part s but also the first parity part $p_1$ and the second parity part $p_2$.

In step 1719, the controller randomly determines the permutation matrixes $P^{a_{ij}}$ in non-zero matrix portions in blocks having a low degree from among the blocks determined according to the degree distribution for guaranteeing a good performance of the block LDPC code, and then ends the procedure. Here, even when permutation matrixes $P^{a_{ij}}$ to be applied to non-zero matrix portions in blocks having a high degree are determined, permutation matrixes $P^{a_{ij}}$ must be determined such that a minimum cycle length of a block cycle is maximized, and the permutation matrixes $P^{a_{ij}}$ are determined considering the block cycles of not only the information part s but also the first parity part $p_1$ and the second parity part $p_2$. An example of the permutation matrixes $P^{a_{ij}}$ arranged in the parity check matrix is illustrated in FIG. 16.

In step 1721, the controller divides the first part p1 and the second parity part p2 into 4 partial matrixes B, T, D and E, and then proceeds to step 1723. In step 1723, the controller does not input zero matrixes, but permutation matrixes $P^y$ and $P^{a_1}$ into 2 partial blocks from among the partial blocks constituting the partial matrix B, and then proceeds to step 1725. The method for not inputting zero matrixes, but permutation matrixes $P^y$ and $P^{a_1}$ into 2 partial blocks from among the partial blocks constituting the partial matrix B has been described with reference to FIG. 15.

In step 1725, the controller inputs the identity matrixes I into the diagonal partial blocks of the partial matrix T, inputs the particular permutation matrixes $P^{a_2}, P^{a_3}, \ldots, P^{a_{n-1}}$ to (i, i+1)$^{th}$ partial blocks under the diagonal components of the partial matrix T, and then proceeds to step 1727. The method for inputting the identity matrixes I into the diagonal partial blocks of the partial matrix T and inputting the particular permutation matrixes $P^{a_2}, P^{a_3}, \ldots, P^{a_{m-1}}$ to (i, i+1)$^{th}$ partial blocks under the diagonal components of the partial matrix T has been described with reference to FIG. 15.

In step 1727, the controller inputs a partial matrix $P^x$ to the partial matrix D, and then proceeds to step 1729. In step 1729, the controller inputs a permutation matrix $P^{a_m}$ to only the last partial block in the partial matrix E, and then ends the procedure. The method for inputting 2 permutation matrixes $P^{a_m}$ to only the last partial block from among the partial blocks constituting the partial matrix E has been described with reference to FIG. 15.

If the partial matrix B, the partial matrix D and the partial matrix E are appropriately formed in the parity check matrix of the block LDPC code, a coding process for the block LDPC code can be easily controlled. A description will now be made of a process of forming a partial matrix B, a partial matrix D and a partial matrix E of the parity check matrix in order to easily control a coding process for the block LDPC code.

When the parity check matrix of FIG. 13 is divided into the partial matrixes described in connection with FIG. 14 in the above manner, FIG. 15 can be considered.

When a codeword vector c is divided into an information part s, a first parity part $p_1$ and a second parity part $p_2$ as illustrated in FIG. 14, the codeword vector c can be divided into an information word vector s, a first parity vector $\underline{p}_1$ and a second parity vector $\underline{p}_2$. In this case, a product of the parity check matrix and the codeword vector $\underline{c}$ can be expressed as Equation (12) and Equation (13).

$$A\underline{s}^T + B\underline{p}_1^T + T\underline{p}_2^T = 0 \tag{12}$$

$$(ET^{-1}A+C)\underline{s}^T + (ET^{-1}B+D)\underline{p}_1^T = 0 \tag{13}$$

In Equation (12), T denotes a transpose operation, and in Equation (13), a part $\underline{p}_1^T$ related to a first parity vector $\underline{p}_1$ can be calculated by $$\underline{p}_1^T = \phi^{-1}(ET^{-1}A+C)\underline{s}^T (\phi \triangleq ET^{-1}B+D) \tag{14}$$

In Equation (14), because the coding complexity of the block LDPC code is in proportion to the square of a size of a matrix $\phi$, the present invention sets the matrix $\phi$ used for calculating the first parity vector $\underline{p}_1$ as an identity matrix I. By setting the matrix $\phi$ as an identity matrix I in this way, the coding complexity of the block LDPC code is minimized. With reference to FIG. 15, a description will now be made of a process of setting the matrix $\phi$ as an identity matrix I.

A permutation matrix $P^{a_1}$ will be fixed to an identity matrix I. In a partial block of the partial matrix $T^{-1}$ illustrated in connection with FIG. 15, a part $P^{k_1 \sim k_2}$ represents a product $$\prod_{i=k_1}^{k_2} P^{a_i} = P^{\sum_{i=k_1}^{k_2} a_i}$$

of a matrix $P^{k_1}$ to a matrix $P^{k_2}$. The matrix $\phi$ can be calculated using Equation (15) to Equation (17) below.

First, in FIG. 15, because a partial matrix E includes all zero matrixes except one partial block, a product of the partial matrix E and an inverse matrix $T^{-1}$ of the partial matrix T can be expressed as a product of the last row of the inverse matrix $T^{-1}$ of the partial matrix T and the last block of the partial matrix E, as shown in Equation (15).

$$ET^{-1} = P^{a_m}[P^{2 \sim (m-1)} \; P^{3 \sim (m-1)} \ldots P^{a(m-1)} \; P^{a(m-1)} \; I] \tag{15}$$

If the product of the partial matrix E and an inverse matrix $T^{-1}$ of the partial matrix T is multiplied by the partial matrix B, the result can be expressed as shown in Equation (16)

$$ET^{-1}B = P^{a_m}P^{2 \sim (m-1)} + P^{a_m}P^{k \sim (m-1)}P^y \tag{16}$$

where k is a particular natural number determined according to a position of $P^y$.

When the product of the partial matrix E and an inverse matrix $T^{-1}$ of the partial matrix T is multiplied by the partial matrix B as illustrated in Equation (16), because the partial matrix B includes all zero matrixes except two partial blocks, multiplication is performed on only the two partial blocks in the partial matrix B, thereby simplifying calculation.

If $D=P^x=P^{a_m}P^{2\sim(m-1)}$ and $P^{a_m}P^{k\sim(m-1)}P^y=I$, then $\phi \approx ET^{-1}B+D=I$. Therefore, the matrix $\phi$ becomes an identity matrix I. Equation (17) below briefly expresses the conditions that the matrix $\phi$ becomes an identity matrix I.

$$x \equiv a_m + \left(\sum_{i=2}^{m-1} a_i\right)(\text{mod}N_s), a_m + \left(\sum_{i=k}^{m-1} a_i\right) + y \equiv 0(\text{mod}N_s) \quad (17)$$

As described with reference to Equation (15) to Equation (17), if the matrix $\phi$ is set as an identity matrix I, a coding process for the block LDPC code can be simplified in its complexity.

Next, with reference to FIG. 18, a description will be made of a procedure for coding a block LDPC code using a parity check matrix designed in the present invention.

Figure 18:
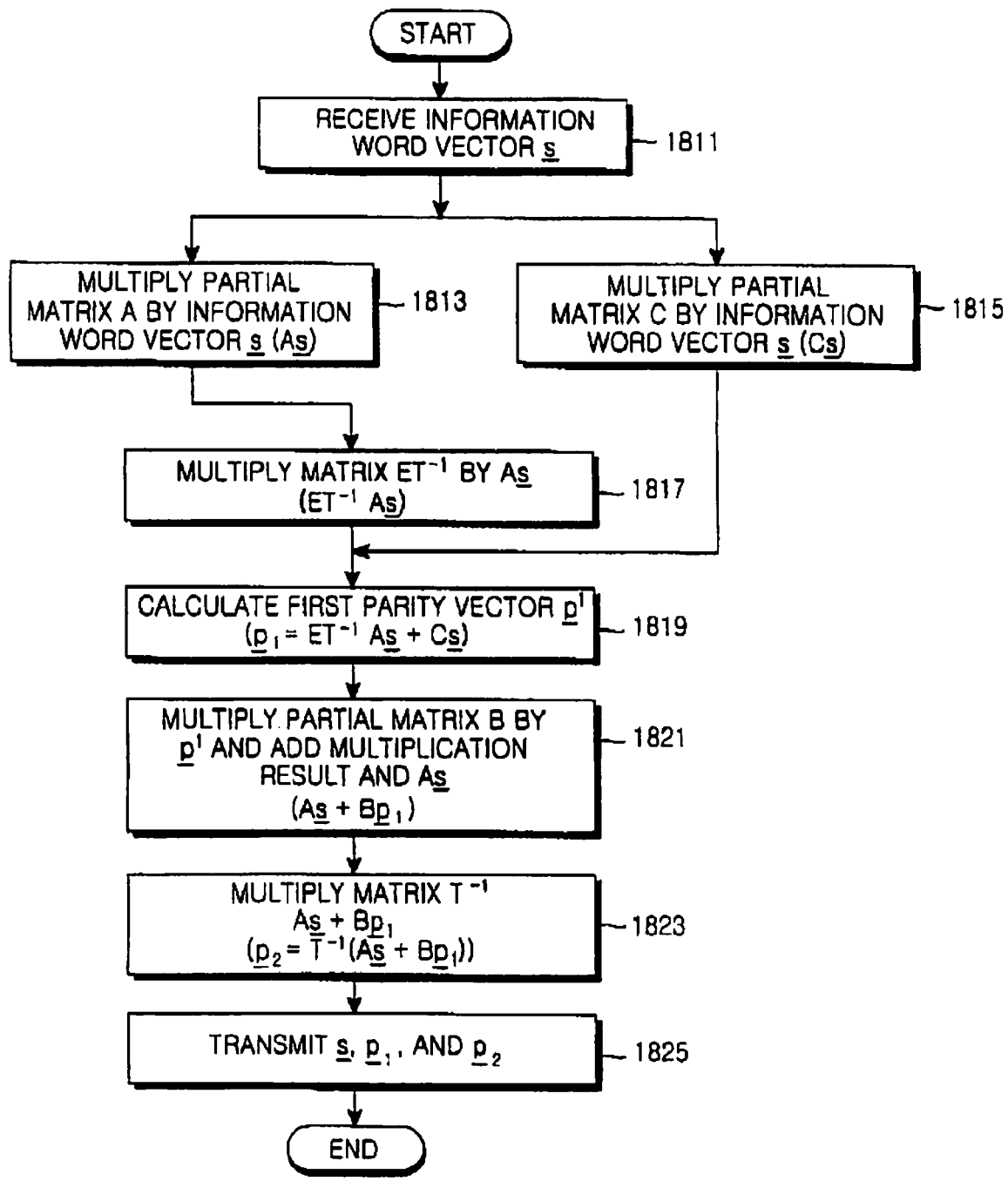
FIG. 18 is a flowchart illustrating a procedure for coding a block LDPC code according to an embodiment of the present invention.

FIG. 18 is a flowchart illustrating a procedure for coding a block LDPC code according to an embodiment of the present invention. Referring to FIG. 18, in step 1811, a controller receives an information word vector s, and then proceeds to steps 1813 and 1815. It will be assumed herein that a length of the information word vector s received for coding the block LDPC code is k. In step 1813, the controller matrix-multiplies the information word vector s by a partial matrix A of a parity check matrix (As), and then proceeds to step 1817. Because the number of the elements having a value of 1 existing in the partial matrix A is much less than the number of the elements having a value of 0 existing in the partial matrix A, the matrix multiplication of the information word vector s and the partial matrix A of the parity check matrix can be achieved with a relatively small number of sum-product calculations. In addition, because the positions of the elements having a value of 1 in the partial matrix A can be expressed with a position of a non-zero block and an exponent of a permutation matrix for its block, the matrix multiplication can be performed with simple calculations as compared with a particular parity check matrix. In step 1815, the controller matrix-multiplies a partial matrix C of the parity check matrix by the information word vector s (Cs), and then proceeds to step 1819.

In step 1817, the controller matrix-multiplies a matrix $ET^{-1}$ by the matrix multiplication result on the information word vector s and the partial matrix A of the parity check matrix ($ET^{-1}As$), and then proceeds to step 1819. As described above, because the number of the elements having a value of 1 in the matrix $ET^{-1}$ is very small, if only an exponent of a permutation matrix of a corresponding block is known, the matrix multiplication can be simply achieved. In step 1819, the controller calculates a first parity vector $p_1$ by adding the $ET^{-1}As$ and the Cs ($p_1=ET^{-1}As+Cs$) and then proceeds to step 1821. Here, the addition calculation is an exclusive OR (XOR) calculation in which when the same bits are added, the addition result becomes '0', and when different bits are added, the addition result becomes '1'. That is, in the process of up to step 1819, the first parity vector $p_1$ of Equation (14) is calculated.

In step 1821, the controller multiplies a partial matrix B of the parity check matrix by the first parity vector $p_1$ ($Bp_1$), adds the $Bp_1$ and the As ($As+Bp_1$), and then proceeds to step 1823. As described in connection with Equation (12), if the information word vector s and the first parity vector $p_1$ are known, an inverse matrix $T^{-1}$ of a partial matrix T in the parity check matrix must be multiplied in order to calculate a second parity vector $p_2$. Therefore, in step 1823, the controller multiplies the vector ($As+Bp_1$) calculated in step 1821 by an inverse matrix $T^{-1}$ of the partial matrix T in order to calculate the second parity vector $p_2$ ($p_2=T^{-1}(As+Bp_1)$), and then proceeds to step 1825. As described above, if only the information word vector s of a block LDPC code to be coded is known, the first parity vector $p_1$ and the second parity vector $p_2$ can be calculated. As a result, a codeword vector can be obtained. In step 1825, the controller transmits a codeword vector c generated with the information word vector s, the first parity vector $p_1$ and the second parity vector $p_2$, and then ends the procedure.

Figure 19:
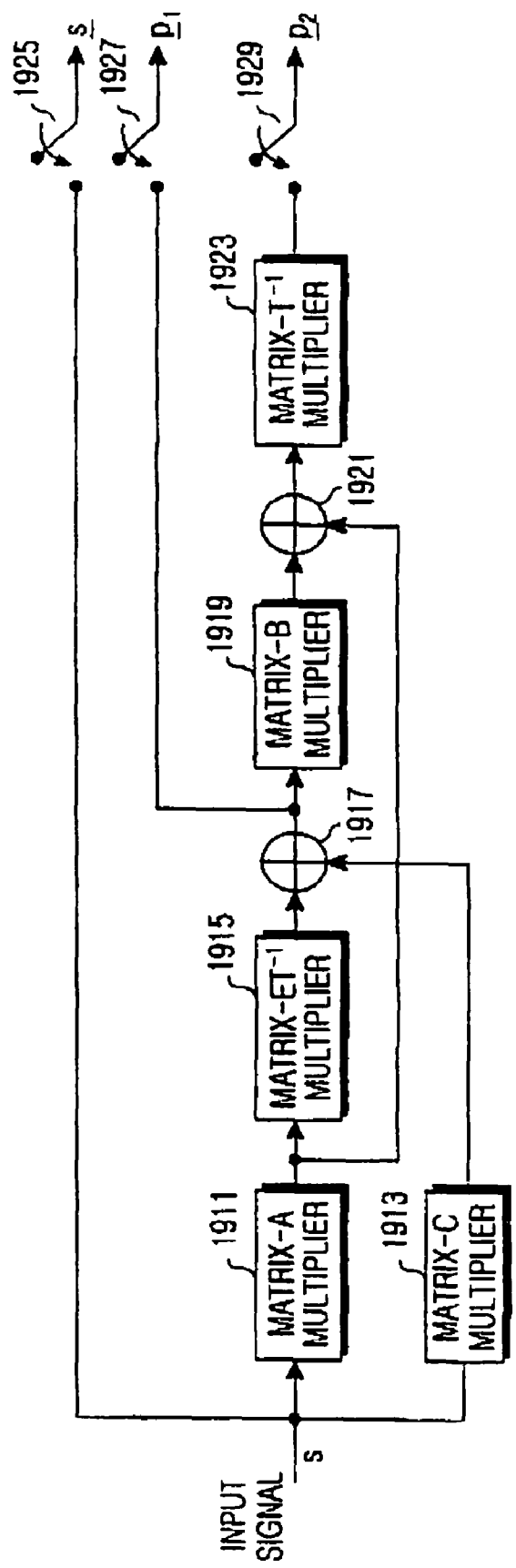
FIG. 19 is a block diagram illustrating an internal structure of a coding apparatus for a block LDPC code according to an embodiment of the present invention.

FIG. 19 is a block diagram illustrating an internal structure of a coding apparatus for a block LDPC code according to an embodiment of the present invention. Referring to FIG. 19, the coding apparatus for a block LDPC code is comprised of a matrix-A multiplier 1911, a matrix-C multiplier 1913, a matrix-$ET^{-1}$ multiplier 1915, a first adder 1917, a matrix-B multiplier 1919, a second adder 1921, a matrix-$T^{-1}$ multiplier 1923, and switches 1925, 1927 and 1929.

When an input signal, i.e. an information word vector s with a length k to be coded with a block LDPC code, is received, the received information word vector s is input to each of the switch 1925, the matrix-A multiplier 1911 and the matrix-C multiplier 1913. The matrix-A multiplier 1911 multiplies the information word vector s by a partial matrix A of the entire parity check matrix, and outputs the multiplication result to the matrix-$ET^{-1}$ multiplier 1915 and the second adder 1921. The matrix-C multiplier 1913 multiplies the information word vector s by a partial matrix C of the entire parity check matrix, and outputs the multiplication result to the first adder 1917. The matrix-$ET^{-1}$ multiplier 1915 multiplies a signal output from the matrix-A multiplier 1911 by a partial matrix $ET^{-1}$ of the entire parity check matrix, and outputs the multiplication result to the first adder 1917.

The first adder 1917 adds a signal output from the matrix-$ET^{-1}$ multiplier 1915 and a signal output from the matrix-C multiplier 1913, and outputs the addition result to the matrix-B multiplier 1919 and the switch 1927. Here, the first adder 1917 performs an XOR calculation on a bit-by-bit basis. For example, when a length-3 vector $x=(x_1, x_2, x_3)$ and a length-3 vector $y=(y_1, y_2, y_3)$ are received, the first adder 1917 XORs the length-3 vector $x=(x_1, x_2, x_3)$ and the length-3 vector $y=(y_1, y_2, y_3)$, and outputs a length-3 vector $z=(x_1 \oplus y_1, x_2 \oplus y_2, x_3 \oplus y_3)$. Here, the $\oplus$ calculation represents the XOR calculation in which when the same bits are added, the addition result becomes '0', and when different bits are added, the addition result becomes '1'. That is, a signal output from the first adder 1917 becomes a first parity vector $p_1$.

The matrix-B multiplier 1919 multiplies a signal, or the first parity vector $p_1$, output from the first adder 1917 by a partial matrix B of the entire parity check matrix, and outputs the multiplication result to the second adder 1921. The second adder 1921 adds a signal output from the matrix-B multiplier 1919 and a signal output from the matrix-A multiplier 1911, and outputs the multiplication result to the matrix-$T^{-1}$ multiplier 1923. The second adder 1921, like the adder 1917, XORs a signal output from the matrix-B multiplier 1919 and a signal output from the matrix-A multiplier 1911, and outputs the result to the matrix-$T^{-1}$ multiplier 1923.

The matrix-$T^{-1}$ matrix 1923 multiplies a signal output from the adder 1921 by the partial matrix $T^{-1}$, and outputs the multiplication result to the switch 1929. Here, an output of the matrix-$T^{-1}$ matrix 1923 becomes a second parity vector $p_2$. The switches 1925, 1927 and 1929 are switched on only at their time to transmit a corresponding signal. That is, at a transmission time of the information word vector s, the switch

1925 is switched on; at a transmission time of the first parity vector $p_1$, the switch 1927 is switched on; and at transmission time of the second parity vector $\underline{p_2}$, the switch 1929 is switched on.

By appropriately selecting the partial matrixes of the entire parity check matrix as described above, the matrix multiplication for $ET^{-1}$ is relatively simplified, thereby facilitating the calculation for $ET^{-1}As^T$. In addition, the matrix $\phi$ becomes an identity matrix I, so that a calculation process for $\phi^{-1}$ for calculating $P_1^T$ is omitted.

As described above, the block LDPC code secures a high efficiency of a memory for storing information related to a parity check matrix according to its structural characteristic, and enables the efficient coding by appropriately selecting a partial matrix in the parity check matrix. However, as the parity check matrix is generated on a block-by-block basis, randomness is reduced. The reduction in randomness may cause degradation in the performance of the block LDPC code. That is, because an irregular block LDPC code is superior in performance to a regular block LDPC code as described above, selecting a partial matrix in the entire parity check matrix acts as a very important factor in designing a block LDPC code.

Now, with reference to FIG. 16, a description will be made of a detailed method for generating a block LDPC code that exhibits excellent performance while enabling the efficient coding while taking into consideration a cycle characteristic of the block LDPC code.

FIG. 16 is a diagram illustrating a parity check matrix of a block LDPC code according to an embodiment of the present invention. Referring to FIG. 16, for structural simplicity, a parity check matrix of the block LDPC code is set such that $P^{a_1}=I$ ($i=1, \ldots, m-1$), $P^{a_m}=P^1$, $P^x=P^1$, and $P^y=P^{-1}$. In this case, as described above, a matrix $\phi$ becomes an identity matrix I, thereby enabling the efficient coding. A block length of a partial matrix of the parity check matrix is $N_s=3$. Therefore, $P^{-1}=P^{30}$. Because the number of blocks for all columns in the parity check matrix is 32, a parity check matrix of a block LDPC code having a total block length of $32 \times 31 = 992$ and a coding rate ½ is generated.

As a result, the block LDPC code illustrated in FIG. 16 becomes an irregular block LDPC code comprised of 15 blocks with weight values 2, 12 blocks with weight values 3, and 5 blocks with weight values 11 on the basis of each column of the parity check matrix. Therefore, the degree distribution of the block LDPC code illustrated in FIG. 16 can be expressed as Equation (18)

$$f_2=15/32, f_3=12/32, f_{11}=5/32, f_{pT}=7/16, f_{pa}=9/16 \qquad (18)$$

In Equation (18), $f_i$ denotes a ratio of the variable nodes with a degree i to all of the variable nodes on a factor graph of the block LDPC code, and $f_{pi}$ denotes a ratio of the check nodes with a degree i to all of the check nodes on a factor graph of the block LDPC code. For example, in case of a block LDPC code with a block length $N_s=32$, the columns of a parity check matrix corresponding to the 15 variable nodes from among a total of 32 variable nodes on a factor graph of the block LDPC code have weight values 2, columns of a parity check matrix corresponding to 12 variable nodes have weight values 3, and columns of a parity check matrix corresponding to 5 variable nodes have weight values 11. Even for the parity check matrix corresponding to the check nodes, the weight can be considered in the same way as done for the variable nodes. The degree distribution illustrated in Equation (18) closely approximates the degree distribution of an LDPC code with n ideal threshold value. Further, in the case of the block LDPC code illustrated in FIG. 16, a minimum length of a cycle existing between a node with a degree of 2 and a node with a degree of 3 is 12, and a minimum length of a cycle between all of the nodes is 6.

Next, with reference to FIG. 20, a description will be made of a process of decoding a block LDPC code using a parity check code according to an embodiment of the present invention.

Figure 20:
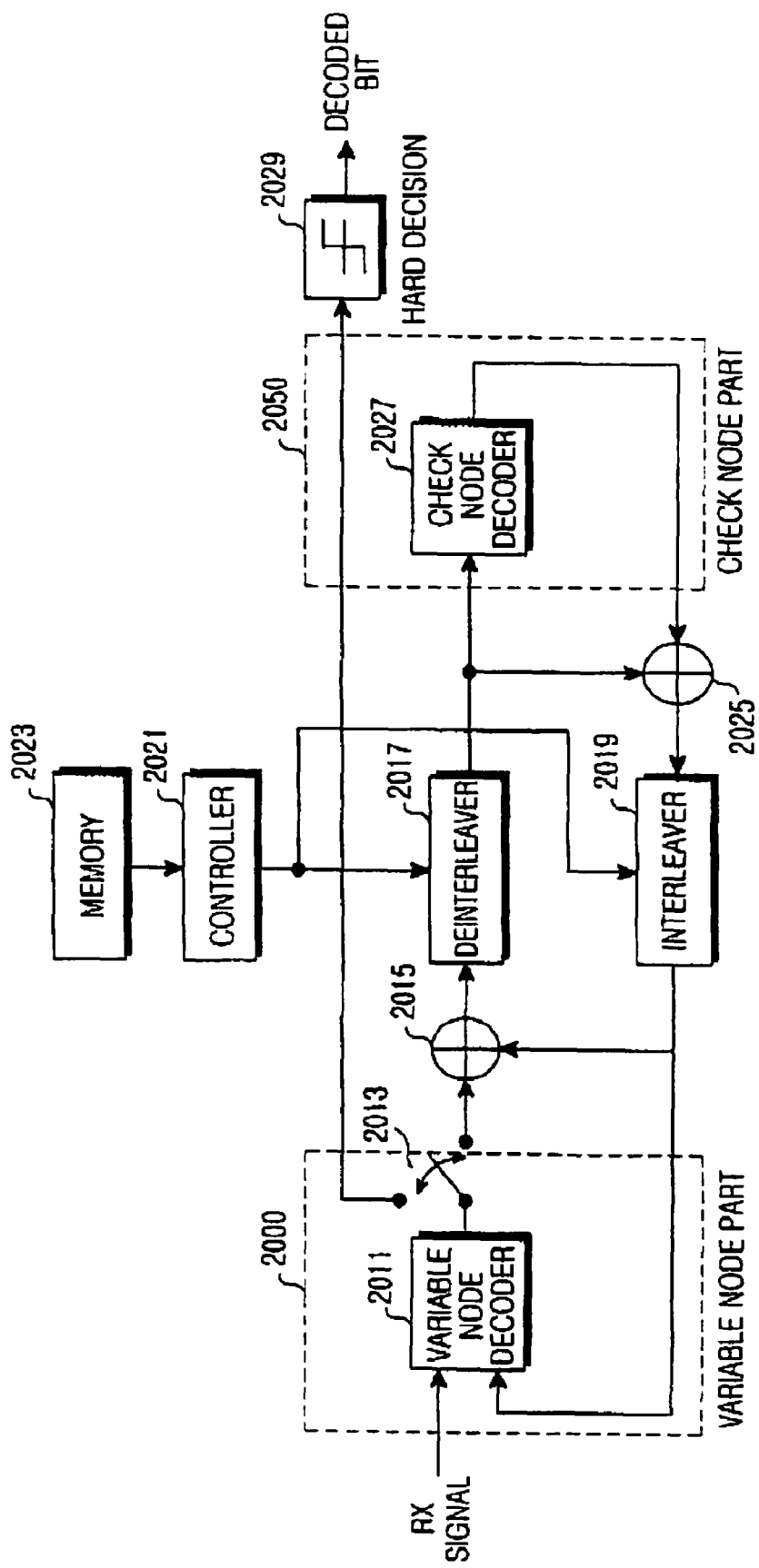
FIG. 20 is a block diagram illustrating an internal structure of a decoding apparatus for a block LDPC code according to an embodiment of the present invention.

FIG. 20 is a block diagram illustrating an internal structure of a decoding apparatus for a block LDPC code according to an embodiment of the present invention. Referring to FIG. 20, the decoding apparatus for a block LDPC code is comprised of a variable node part 2000, a first adder 2015, a deinterleaver 2017, an interleaver 2019, a controller 2021, a memory 2023, a second adder 2025, a check node part 2050, and a hard-decision unit 2029. The variable node part 2000 is comprised of a variable node decoder 2011, and a switch 2013, and the check node part 2050 is comprised of a check node decoder 2027.

A reception signal received over a radio channel is input to the variable node decoder 2011 in the variable node part 2000, and the variable node decoder 2011 calculates the probability values of the reception signal, updates the calculated probability values and outputs the updated probability values to the switch 2013 and the first adder 2015. The variable node decoder 2011 connects the variable nodes according to a parity check matrix previously set in the decoding apparatus for the block LDPC code, and performs an update calculation having as many input and output values as the number of '1's connected to the variable nodes. The number of '1's connected to each of the variable nodes is identical to a weight of each of columns constituting the parity check matrix. Therefore, internal calculation of the variable node decoder 2011 is different according to a weight of each of the columns constituting the parity check matrix.

The first adder 2015 receives a signal output from the variable node decoder 2011 and an output signal of the interleaver 2019 in a previous iterative decoding process, subtracts the output signal of the interleaver 2019 in the previous iterative decoding from the signal output from the variable node decoder 2011 in the current decoding process, and outputs the subtraction result to the deinterleaver 2017. If the decoding process is an initial decoding process, the output signal of the interleaver 2019 should be regarded as '0'.

The deinterleaver 2017 deinterleaves a signal output from the first adder 2015 according to a predetermined technique, and outputs the deinterleaved signal to the second adder 2025 and the check node decoder 2027. The deinterleaver 2017 has an internal structure corresponding to the parity check matrix, because an output value for an input value of the interleaver 2019 corresponding to the deinterleaver 2017 becomes different according to the positions of the elements having a value of 1 in the parity check matrix.

The second adder 2025 receives an output signal of the check node decoder 2027 in a previous iterative decoding process and an output signal of the deinterleaver 2017, subtracts the output signal of the deinterleaver 2017 from the output signal of the check node decoder 2027 in the previous iterative decoding process, and outputs the subtraction result to the interleaver 2019. The check node decoder 2027 connects the check nodes according to a parity check matrix previously set in the decoding apparatus for the block LDPC code, and performs the update calculation having as many input and output values as the number of '1's connected to the check nodes. The number of '1's connected to each of the check nodes is identical to a weight of each of the rows constituting the parity check matrix. Therefore, an internal calculation of the check node decoder 2027 is different according to a weight of each of the rows constituting the parity check matrix.

The interleaver 2019, under the control of the controller 2021, interleaves a signal output from the second adder 2025 according to a predetermined technique, and outputs the interleaved signal to the adder 2015 and the variable node decoder 2011. The controller 2021 reads the interleaving technique-related information stored in the memory 2023 and controls an interleaving technique of the interleaver 2019 according to the read interleaving technique-related information. Also, if the decoding process is an initial decoding process, an output signal of the deinterleaver 2017 should be regarded as '0'.

By repeatedly performing the above processes, the decoding apparatus secures error-free high-reliability decoding, and after the decoding apparatus performs the iterative decoding as many times as a predetermined number of iterations, the switch 2013 switches-off the variable node decoder 2011 from the second adder 2015, and at the same time, switches-on the variable node decoder 2011 to the hard-decision unit 2029 so that the signal output from the variable node decoder 2011 is output to the hard-decision unit 2029. The hard-decision unit 2029 makes a hard decision on the signal output from the variable node decoder 2011 and outputs the hard-decision result, and an output value of the hard-decision unit 2029 becomes a finally decoded value.

As can be understood from the foregoing description, the present invention provides a block LDPC code with a maximized minimum cycle length in a mobile communication system, thereby maximizing the error correcting capability and improving the system performance. In addition, the present invention generates an efficient parity check matrix, thereby minimizing coding complexity of a block LDPC code.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for generating a block low density parity check (LDPC) code by an encoding apparatus, the method comprising:
   generating a block LDPC code by encoding an information word using a parity check matrix with a size corresponding to a coding rate and a codeword length used for encoding an information word as the block LDPC code,
   wherein the parity check matrix includes a plurality of blocks, the plurality of blocks are classified into first blocks corresponding to an information part that corresponds to the information word, second blocks corresponding to a first parity part that corresponds to a parity, and third blocks corresponding to a second parity part that corresponds to the parity, and
   wherein permutation matrixes include first permutation matrixes arranged in blocks from among the second blocks classified as the first parity part, and include second permutation matrixes arranged in blocks from among the third blocks classified as the second parity part in a lower triangular form block by block.

2. The method of claim 1, wherein the first blocks classified as the information part are classified into blocks corresponding to a first partial block and blocks corresponding to a second partial block, the second blocks classified as the first parity part are classified into blocks corresponding to a third partial block and blocks corresponding to a fourth partial block, and the third blocks classified as the second parity part are classified into blocks corresponding to a fifth partial block and blocks corresponding to a sixth partial block,
   wherein the permutation matrixes are determined such that a matrix determined by adding a matrix product of a sixth partial matrix, an inverse matrix of a fifth partial matrix, and a third matrix, with a fourth partial matrix is an identity matrix, and
   wherein the sixth partial matrix corresponds to the sixth partial block, the fifth partial matrix corresponds to the fifth partial block, the third partial matrix corresponds to the third partial block, and the fourth partial matrix corresponds to the fourth partial block.

3. The method of claim 2, wherein identity matrixes are arranged in blocks including a diagonal from among the blocks classified as the fifth partial block, and blocks in lower blocks of the blocks including the diagonal,
   wherein the third partial block includes a first matrix, a second matrix, and zero matrixes, and the sixth partial block includes a third matrix and zero matrixes,
   wherein the first matrix is arranged in a first block from among blocks included in the third partial block, the second matrix is arranged in a block, except for the first block, from among blocks included in the third partial block,
   wherein the first matrix and the second matrix are permutation matrixes, an exponent of the first matrix is A as an arbitrary value, and an exponent of the second matrix is zero,
   wherein the third matrix is arranged in a last block from among blocks included in the sixth partial block, and the third matrix is an identity matrix, and
   wherein the fourth matrix is a permutation matrix, and an exponent of the fourth matrix is A.

4. The method of claim 1, wherein the first blocks classified as the information part are classified into blocks corresponding to a first partial block and blocks corresponding to a second partial block, the second blocks classified as the first parity part are classified into blocks corresponding to a third partial block and blocks corresponding to a fourth partial block, and the third blocks classified as the second parity part are classified into blocks corresponding to a fifth partial block and blocks corresponding to a sixth partial block, and
   wherein permutation matrixes are arranged in two blocks from among the blocks corresponding to the third partial block, zero matrixes are arranged in blocks, except for the two blocks, from among the blocks corresponding to the third partial block, a permutation matrix is arranged in a block from among the blocks corresponding to the fourth partial block, a permutation matrix is arranged in one block from among the blocks corresponding to the sixth partial block, and zero matrixes are arranged in blocks, except for the one block, from among the blocks corresponding to the sixth partial block.

5. The method of claim 4, wherein one of the permutation matrixes arranged in the two blocks is an identity matrix.

6. The method of claim 1, wherein the permutation matrixes are arranged in the blocks classified as the information part such that a weight value of the information part is irregular.

7. The method of claim 1, wherein the permutation matrixes are arranged in blocks having a degree less than a predetermined degree from among the determined blocks where the permutation matrixes will be arranged, such that a minimum cycle length on a factor graph of the block LDPC code is a predetermined length, and wherein the permutation matrixes are randomly arranged in blocks having a degree greater than or equal to a predetermined degree from among the determined blocks where the permutation matrixes will be arranged.

8. The method of claim 1, wherein permutation matrixes are arranged in blocks including a diagonal of the first partial block, block by block, when the third blocks classified as the second parity part are classified into blocks corresponding to a first partial block and blocks corresponding to a second partial block.

9. The method of claim 8, wherein the permutation matrixes arranged in blocks including the diagonal are identity matrixes.

10. The method of claim 9, wherein permutation matrixes are arranged in lower blocks of the blocks including the diagonal.

11. The method of claim 9, wherein a permutation matrix is arranged in a last block from among the blocks classified as the second partial block.

12. A system for processing a block low density parity check (LDPC) code, the system comprising:
an encoding apparatus for generating a block LDPC code by encoding an information word using a parity check matrix with a size corresponding to a coding rate and a codeword length used for encoding an information word as the block LDPC code,
wherein the parity check matrix includes a plurality of blocks, the plurality of blocks are classified into first blocks corresponding to an information part that corresponds to the information word, second blocks corresponding to a first parity part that corresponds to a parity, and third blocks corresponding to a second parity part that corresponds to the parity, and
wherein permutation matrixes include first permutation matrixes arranged in blocks from among the second blocks classified as the first parity part, and include second permutation matrixes arranged in blocks from among the third blocks classified as the second parity part in a lower triangular form block by block.

13. The system of claim 12, wherein the first blocks classified as the information part are classified into blocks corresponding to a first partial block and blocks corresponding to a second partial block, the second blocks classified as the first parity part are classified into blocks corresponding to a third partial block and blocks corresponding to a fourth partial block, and the third blocks classified as the second parity part are classified into blocks corresponding to a fifth partial block and blocks corresponding to a sixth partial block,
wherein the permutation matrixes are determined such that a matrix determined by adding a matrix product of a sixth partial matrix, an inverse matrix of a fifth partial matrix, and a third matrix, with a fourth partial matrix is an identity matrix, and
wherein the sixth partial matrix corresponds to the sixth partial block, the fifth partial matrix corresponds to the fifth partial block, the third partial matrix corresponds to the third partial block, and the fourth partial matrix corresponds to the fourth partial block.

14. The system of claim 13, wherein identity matrixes are arranged in blocks including a diagonal from among the blocks classified as the fifth partial block, and blocks in lower blocks of the blocks including the diagonal,
wherein the third partial block includes a first matrix, a second matrix, and zero matrixes, and the sixth partial block includes a third matrix and zero matrixes,
wherein the first matrix is arranged in a first block from among blocks included in the third partial block, the second matrix is arranged in a block, except for the first block, from among blocks included in the third partial block,
wherein the first matrix and the second matrix are permutation matrixes, an exponent of the first matrix is A as an arbitrary value, and an exponent of the second matrix is zero,
wherein the third matrix is arranged in a last block from among blocks included in the sixth partial block, and the third matrix is an identity matrix, and
wherein the fourth matrix is a permutation matrix, and an exponent of the fourth matrix is A.

15. The system of claim 12, wherein the first blocks classified as the information part are classified into blocks corresponding to a first partial block and blocks corresponding to a second partial block, the second blocks classified as the first parity part are classified into blocks corresponding to a third partial block and blocks corresponding to a fourth partial block, and the third blocks classified as the second parity part are classified into blocks corresponding to a fifth partial block and blocks corresponding to a sixth partial block, and
wherein permutation matrixes are arranged in two blocks from among the blocks corresponding to the third partial block, zero matrixes are arranged in blocks, except for the two blocks, from among the blocks corresponding to the third partial block, a permutation matrix is arranged in a block from among the blocks corresponding to the fourth partial block, a permutation matrix is arranged in one block from among the blocks corresponding to the sixth partial block, and zero matrixes are arranged in blocks, except for the one block, from among the blocks corresponding to the sixth partial block.

16. The system of claim 15, wherein one of the permutation matrixes arranged in the two blocks is an identity matrix.

17. The system of claim 12, wherein the permutation matrixes are arranged in the blocks classified as the information part such that a weight value of the information part is irregular.

18. The system of claim 12, wherein the permutation matrixes are arranged in blocks having a degree less than a predetermined degree from among the determined blocks where the permutation matrixes will be arranged, such that a minimum cycle length on a factor graph of the block LDPC code is a predetermined length, and
wherein the permutation matrixes are randomly arranged in blocks having a degree greater than or equal to a predetermined degree from among the determined blocks where the permutation matrixes will be arranged.

19. The system of claim 12, wherein permutation matrixes are arranged in blocks including a diagonal of the first partial block, block by block, when the third blocks classified as the second parity part are classified into blocks corresponding to a first partial block and blocks corresponding to a second partial block.

20. The system of claim 19, wherein the permutation matrixes arranged in blocks including the diagonal are identity matrixes.

21. The system of claim 20, wherein permutation matrixes are arranged in lower blocks of the blocks including the diagonal.

22. The system of claim 21, wherein a permutation matrix is arranged in a last block from among the blocks classified as the second partial block.

23. A method for decoding a block low density parity check (LDPC) code by a decoding apparatus, the method comprising:

decoding a block LDPC code using a parity check matrix with a size corresponding to a coding rate and a codeword length used for encoding an information word as the block LDPC code, wherein the parity check matrix includes a plurality of blocks, the plurality of blocks are classified into first blocks corresponding to an information part that corresponds to the information word, second blocks corresponding to a first parity part that corresponds to a parity, and third blocks corresponding to a second parity part that corresponds to the parity, and wherein permutation matrixes include first permutation matrixes arranged in blocks from among the second blocks classified as the first parity part, and include second permutation matrixes arranged in blocks from among the third blocks classified as the second parity part in a lower triangular form block by block.

24. The method of claim 23, wherein the first blocks classified as the information part are classified into blocks corresponding to a first partial block and blocks corresponding to a second partial block, the second blocks classified as the first parity part are classified into blocks corresponding to a third partial block and blocks corresponding to a fourth partial block, and the third blocks classified as the second parity part are classified into blocks corresponding to a fifth partial block and blocks corresponding to a sixth partial block, wherein the permutation matrixes are determined such that a matrix determined by adding a matrix product of a sixth partial matrix, an inverse matrix of a fifth partial matrix, and a third matrix, with a fourth partial matrix is an identity matrix, and wherein the sixth partial matrix corresponds to the sixth partial block, the fifth partial matrix corresponds to the fifth partial block, the third partial matrix corresponds to the third partial block, and the fourth partial matrix corresponds to the fourth partial block.

25. The method of claim 24, wherein identity matrixes are arranged in blocks including a diagonal from among the blocks classified as the fifth partial block, and blocks in lower blocks of the blocks including the diagonal, wherein the third partial block includes a first matrix, a second matrix, and zero matrixes, and the sixth partial block includes a third matrix and zero matrixes, wherein the first matrix is arranged in a first block from among blocks included in the third partial block, the second matrix is arranged in a block, except for the first block, from among blocks included in the third partial block, wherein the first matrix and the second matrix are permutation matrixes, an exponent of the first matrix is A as an arbitrary value, and an exponent of the second matrix is zero, wherein the third matrix is arranged in a last block from among blocks included in the sixth partial block, and the third matrix is an identity matrix, and wherein the fourth matrix is a permutation matrix, and an exponent of the fourth matrix is A.

26. The method of claim 23, wherein the first blocks classified as the information part are classified into blocks corresponding to a first partial block and blocks corresponding to a second partial block, the second blocks classified as the first parity part are classified into blocks corresponding to a third partial block and blocks corresponding to a fourth partial block, and the third blocks classified as the second parity part are classified into blocks corresponding to a fifth partial block and blocks corresponding to a sixth partial block, and wherein permutation matrixes are arranged in two blocks from among the blocks corresponding to the third partial block, zero matrixes are arranged in blocks, except for the two blocks, from among the blocks corresponding to the third partial block, a permutation matrix is arranged in a block from among the blocks corresponding to the fourth partial block, a permutation matrix is arranged in one block from among the blocks corresponding to the sixth partial block, and zero matrixes are arranged in blocks, except for the one block, from among the blocks corresponding to the sixth partial block.

27. The method of claim 26, wherein one of the permutation matrixes arranged in the two blocks is an identity matrix.

28. The method of claim 23, wherein the permutation matrixes are arranged in the blocks classified as the information part such that a weight value of the information part is irregular.

29. The method of claim 23, wherein the permutation matrixes are arranged in blocks having a degree less than a predetermined degree from among the determined blocks where the permutation matrixes will be arranged, such that a minimum cycle length on a factor graph of the block LDPC code is a predetermined length, and wherein the permutation matrixes are randomly arranged in blocks having a degree greater than or equal to a predetermined degree from among the determined blocks where the permutation matrixes will be arranged.

30. The method of claim 23, wherein permutation matrixes are arranged in blocks including a diagonal of the first partial block, block by block, when the third blocks classified as the second parity part are classified into blocks corresponding to a first partial block and blocks corresponding to a second partial block.

31. The method of claim 30, wherein the permutation matrixes arranged in blocks including the diagonal are identity matrixes.

32. The method of claim 31, wherein permutation matrixes are arranged in lower blocks of the blocks including the diagonal.

33. The method of claim 31, wherein a permutation matrix is arranged in a last block from among the blocks classified as the second partial block.

34. A system for processing a block low density parity check (LDPC) code, the system comprising:

a decoding apparatus for decoding a block LDPC code using a parity check matrix with a size corresponding to a coding rate and a codeword length used for encoding an information word as the block LDPC code, wherein the parity check matrix includes a plurality of blocks, the plurality of blocks are classified into first blocks corresponding to an information part that corresponds to the information word, second blocks corresponding to a first parity part that corresponds to a parity, and third blocks corresponding to a second parity part that corresponds to the parity, and wherein permutation matrixes include first permutation matrixes arranged in blocks from among the second blocks classified as the first parity part, and include second permutation matrixes arranged in blocks from among the third blocks classified as the second parity part in a lower triangular form block by block.

35. The system of claim 34, wherein the first blocks classified as the information part are classified into blocks corresponding to a first partial block and blocks corresponding to a second partial block, the second blocks classified as the first parity part are classified into blocks corresponding to a third partial block and blocks corresponding to a fourth partial block, and the third blocks classified as the second parity part are classified into blocks corresponding to a fifth partial block and blocks corresponding to a sixth partial block,
- wherein the permutation matrixes are determined such that a matrix determined by adding a matrix product of a sixth partial matrix, an inverse matrix of a fifth partial matrix, and a third matrix, with a fourth partial matrix is an identity matrix, and
- wherein the sixth partial matrix corresponds to the sixth partial block, the fifth partial matrix corresponds to the fifth partial block, the third partial matrix corresponds to the third partial block, and the fourth partial matrix corresponds to the fourth partial block.

36. The system of claim 35, wherein identity matrixes are arranged in blocks including a diagonal from among the blocks classified as the fifth partial block, and blocks in lower blocks of the blocks including the diagonal,
- wherein the third partial block includes a first matrix, a second matrix, and zero matrixes, and the sixth partial block includes a third matrix and zero matrixes,
- wherein the first matrix is arranged in a first block from among blocks included in the third partial block, the second matrix is arranged in a block, except for the first block, from among blocks included in the third partial block,
- wherein the first matrix and the second matrix are permutation matrixes, an exponent of the first matrix is A as an arbitrary value, and an exponent of the second matrix is zero,
- wherein the third matrix is arranged in a last block from among blocks included in the sixth partial block, and the third matrix is an identity matrix, and
- wherein the fourth matrix is a permutation matrix, and an exponent of the fourth matrix is A.

37. The system of claim 34, wherein the first blocks classified as the information part are classified into blocks corresponding to a first partial block and blocks corresponding to a second partial block, the second blocks classified as the first parity part are classified into blocks corresponding to a third partial block and blocks corresponding to a fourth partial block, and the third blocks classified as the second parity part are classified into blocks corresponding to a fifth partial block and blocks corresponding to a sixth partial block, and
- wherein permutation matrixes are arranged in two blocks from among the blocks corresponding to the third partial block, zero matrixes are arranged in blocks, except for the two blocks, from among the blocks corresponding to the third partial block, a permutation matrix is arranged in a block from among the blocks corresponding to the fourth partial block, a permutation matrix is arranged in one block from among the blocks corresponding to the sixth partial block, and zero matrixes are arranged in blocks, except for the one block, from among the blocks corresponding to the sixth partial block.

38. The system of claim 37, wherein one of the permutation matrixes arranged in the two blocks is an identity matrix.

39. The system of claim 34, wherein the permutation matrixes are arranged in the blocks classified as the information part such that a weight value of the information part is irregular.

40. The system of claim 34, wherein the permutation matrixes are arranged in blocks having a degree less than a predetermined degree from among the determined blocks where the permutation matrixes will be arranged, such that a minimum cycle length on a factor graph of the block LDPC code is a predetermined length, and
- wherein the permutation matrixes are randomly arranged in blocks having a degree greater than or equal to a predetermined degree from among the determined blocks where the permutation matrixes will be arranged.

41. The system of claim 34, wherein permutation matrixes are arranged in blocks including a diagonal of the first partial block, block by block, when the third blocks classified as the second parity part are classified into blocks corresponding to a first partial block and blocks corresponding to a second partial block.

42. The system of claim 41, wherein the permutation matrixes arranged in blocks including the diagonal are identity matrixes.

43. The system of claim 42, wherein permutation matrixes are arranged in lower blocks of the blocks including the diagonal.

44. The system of claim 42, wherein a permutation matrix is arranged in a last block from among the blocks classified as the second partial block.

* * * * *